(12) United States Patent
Nishiyama et al.

(10) Patent No.: US 10,209,554 B2
(45) Date of Patent: Feb. 19, 2019

(54) METHOD FOR MANUFACTURING LAMINATED RESIN BLACK-MATRIX SUBSTRATE

(71) Applicant: TORAY INDUSTRIES, INC., Tokyo (JP)

(72) Inventors: Masahito Nishiyama, Otsu (JP); Yoshinori Matoba, Otsu (JP); Harushi Nonaka, Otsu (JP)

(73) Assignee: Toray Industries, Inc., Tokyo (JP)

(*) Notice: Subject to any disclaimer, the term of this patent is extended or adjusted under 35 U.S.C. 154(b) by 418 days.

(21) Appl. No.: 14/898,938

(22) PCT Filed: Jun. 12, 2014

(86) PCT No.: PCT/JP2014/065557
§ 371 (c)(1),
(2) Date: Dec. 16, 2015

(87) PCT Pub. No.: WO2014/203794
PCT Pub. Date: Dec. 24, 2014

(65) Prior Publication Data
US 2016/0370646 A1    Dec. 22, 2016

(30) Foreign Application Priority Data

Jun. 17, 2013  (JP) .................... 2013-126632
Feb. 12, 2014  (JP) .................... 2014-024646

(51) Int. Cl.
*G02F 1/1335*    (2006.01)
*G03F 7/11*    (2006.01)
(Continued)

(52) U.S. Cl.
CPC ....... *G02F 1/133512* (2013.01); *G02B 5/201* (2013.01); *G03F 7/0007* (2013.01);
(Continued)

(58) Field of Classification Search
CPC .............................. G02F 1/133512
See application file for complete search history.

(56) References Cited

U.S. PATENT DOCUMENTS 5,721,599 A * 2/1998 Cheng .............. G02F 1/133512
                                                     349/106
6,654,075 B1 * 11/2003 Takeichi ......... G02F 1/134336
                                                     349/43
(Continued)

FOREIGN PATENT DOCUMENTS

JP    6132208    5/1994
JP    6331816    12/1994
(Continued)

OTHER PUBLICATIONS

International Search Report for International Application No. PCT/JP2014/065557 dated Jul. 15, 2014.

*Primary Examiner* — Alexander Gross
(74) *Attorney, Agent, or Firm* — RatnerPrestia

(57) ABSTRACT

The present invention discloses a method for producing a laminated-resin black matrix that has a sufficient optical density and a low reflectance and that can be precisely processed, and a color filter substrate that includes a laminated-resin black matrix substrate produced by the method. The method for producing a laminated-resin black matrix substrate includes the step of exposing, in a single step, a laminate of a coating A of a non-photosensitive resin composition A that contains a light-shielding material and a coating B of a resin composition B that contains a light-shielding material, the laminate being on a substrate, and the step of developing the exposed laminate. The color filter substrate includes red, green, or blue pixels formed in apertures in a laminated-resin black matrix substrate produced by the method.

18 Claims, 3 Drawing Sheets

(51) Int. Cl.
  *H01L 51/52* (2006.01)
  *G02B 5/20* (2006.01)
  *G03F 7/00* (2006.01)
  *G03F 7/033* (2006.01)
  *G03F 7/105* (2006.01)

(52) U.S. Cl.
  CPC .............. *G03F 7/033* (2013.01); *G03F 7/105* (2013.01); *G03F 7/11* (2013.01); *H01L 51/5284* (2013.01); *G02F 1/133514* (2013.01)

(56) References Cited

U.S. PATENT DOCUMENTS

| | | | |
|---|---|---|---|
| 2002/0090494 A1* | 7/2002 | Song | G02B 5/201 428/167 |
| 2006/0204730 A1 | 9/2006 | Nakamura | |
| 2010/0038606 A1* | 2/2010 | Inoue | B82Y 30/00 252/586 |
| 2011/0062859 A1* | 3/2011 | Kawamura | H01L 27/322 313/504 |
| 2011/0249339 A1 | 10/2011 | Horie | |
| 2014/0320777 A1* | 10/2014 | Fukushima | G02F 1/133305 349/43 |
| 2016/0103531 A1* | 4/2016 | Kimura | G02F 1/13338 345/174 |

FOREIGN PATENT DOCUMENTS

| | | | |
|---|---|---|---|
| JP | 6331817 | | 12/1994 |
| JP | 0843619 | * | 2/1996 |
| JP | 08146410 | | 6/1996 |
| JP | 1073717 | | 3/1998 |
| JP | 2001183511 | | 7/2001 |
| JP | 200366597 | | 3/2003 |
| JP | 2006209102 | | 8/2006 |
| JP | 2010095716 | | 4/2010 |
| JP | 4837297 | | 12/2011 |
| WO | 2010070929 | | 6/2010 |

* cited by examiner

METHOD FOR MANUFACTURING LAMINATED RESIN BLACK-MATRIX SUBSTRATE

CROSS REFERENCE TO RELATED APPLICATIONS

This is the U.S. National Phase application of PCT/JP2014/065557, filed Jun. 12, 2014, which claims priority to Japanese Patent Application No. 2013-126632, filed Jun. 17, 2013, and Japanese Patent Application No. 2014-024646, filed Feb. 12, 2014, the disclosures of each of these applications being incorporated herein by reference in their entireties for all purposes.

FIELD OF THE INVENTION

The present invention relates to a method for producing a laminated-resin black matrix substrate.

BACKGROUND OF THE INVENTION

Liquid crystal display devices include a liquid crystal layer disposed between two substrates and provide light and dark images by using the electro-optical response of the liquid crystal layer, while the display devices can display color images by using a color filter substrate.

Conventionally, the predominant black matrices formed in color filter substrate have been thin metal films of a chromium material, while resin black matrices that include a resin and a light-shielding material have been developed for reducing costs and environmental pollution.

However, although liquid crystal display devices including a color filter substrate, on which a resin black matrix containing a light-shielding material such as carbon black was formed, exhibit good visibility in indoor environments, the devices have the problem of reduced visibility in outdoor environments due to reflection of external light caused by the resin black matrix.

In view of the foregoing, various investigations have been carried out to provide a resin black matrix having a high optical density and a low reflectance from the back side surface of the substrate. For example, a method of using black colorant particles having a surface coated with an insulating material (Patent Document 1), a method of adding carbon black to titanium nitride oxide (Patent Document 2), a method of mixing titanium nitride with titanium carbide (Patent Document 3), a method of providing a two-layered structure of a color relief layer and a black relief layer (Patent Document 4), and a method of providing a two-layered structure of a light absorbing layer that contains shape-anisotropic metal particles and a reflected-light absorbing layer (Patent Document 5) have been proposed.

PATENT DOCUMENTS

Patent Document 1: Japanese Unexamined Patent Application Publication No. 2001-183511
Patent Document 2: Japanese Unexamined Patent Application Publication No. 2006-209102
Patent Document 3: Japanese Unexamined Patent Application Publication No. 2010-95716
Patent Document 4: Japanese Unexamined Patent Application Publication No. H08-146410
Patent Document 5: Japanese Patent No. 4837297

SUMMARY OF THE INVENTION

Essentially, highly light-shielding materials have a high reflectance, and thus it has been very difficult to provide a resin black matrix having both of a sufficient optical density and a low reflectance. In the method of providing a resin black matrix that has a two-layered structure, it is also difficult to precisely process the matrix because the metal particles are used.

Thus, the present invention has an object to provide a method for producing a laminated-resin black matrix that has a sufficient optical density and a low reflectance and that can be precisely processed.

The present invention includes providing a laminated-resin black matrix substrate and the like, as described in (1)-(17) below according to exemplary embodiments:

(1) A method for producing a laminated-resin black matrix substrate, the method including the step of exposing, in a single step, a laminate of a coating A of a non-photosensitive resin composition A that contains a light-shielding material and a coating B of a resin composition B that contains a light-shielding material, the laminate being on a substrate, and the step of developing the exposed laminate.

(2) The method for producing a laminated-resin black matrix substrate according to (1), wherein the ratio (M/L) of the content M of the light-shielding material in the coating B to the content L of the light-shielding material in the coating A is 1.1 or more.

(3) The method for producing a laminated-resin black matrix substrate according to (1) or (2), wherein the resin composition B is a photosensitive resin composition.

(4) The method for producing a laminated-resin black matrix substrate according to any one of (1)-(3), wherein the non-photosensitive resin composition A contains a polyimide resin.

(5) The method for producing a laminated-resin black matrix substrate according to any one of (1)-(4), wherein the method further includes the step of applying the non-photosensitive resin composition A on the substrate to provide the coating A, and the step of applying the resin composition B on the coating A to provide the coating B.

(6) The method for producing a laminated-resin black matrix substrate according to any one of (1)-(5), wherein the method further includes the step of drying or heating the coating A, and the step of drying or heating the coating B.

(7) The method for producing a laminated-resin black matrix substrate according to any one of (1)-(6), wherein the method further includes the step of heating the laminated-resin black matrix.

(8) The method for producing a laminated-resin black matrix substrate according to (7), wherein the heating temperature is 230° C.-275° C. in the step of heating the laminated-resin black matrix.

(9) The method for producing a laminated-resin black matrix substrate according to any one of (1)-(8), wherein the ratio (x/y) of the thickness x of the coating A to the thickness y of the coating B is 1.5-5.0.

(10) The method for producing a laminated-resin black matrix substrate according to any one of (1)-(9), wherein the total (x+y) of the thickness x of the coating A and the thickness y of the coating B is 1.2-2.0 μm.

(11) The method for producing a laminated-resin black matrix substrate according to any one of (1)-(10), wherein the L is 20-50% by mass.

(12) The method for producing a laminated-resin black matrix substrate according to any one of (1)-(11), wherein the M is 45-65% by mass.

(13) The method for producing a laminated-resin black matrix substrate according to any one of (1)-(12), wherein the difference between the dissolution time of the coating A in areas where a pattern does not remain and the dissolution time of the coating B in areas where a pattern does not remain is not more than ±15 seconds in the step of developing the exposed laminate to provide a laminated-resin black matrix.

(14) A color filter substrate that includes red, green, or blue pixels formed in apertures in the laminated-resin black matrix/substrate composite produced by the method according to any one of (1)-(13).

(15) The color filter substrate according to any one of (1)-(14), wherein the substrate is a polyimide resin film.

(16) A liquid crystal display device that includes a liquid crystal compound filled between the color filter substrate according to (15) and an opposite substrate.

(17) A light emitting device that includes the color filter substrate according to (15) bonded to a light emitting element.

(18) The light emitting device according to (17), wherein the light emitting element is an organic EL element.

The method for producing a laminated-resin black matrix substrate of the present invention can provide a liquid crystal display device and a light emitting device that not only have a sufficient light-shielding capabilities to provide opaqueness to light from a backlight and high-contrast clear images, but also have a very high visibility and thus provide high-quality images under external light, due to the low reflectance.

DETAILED DESCRIPTION OF EMBODIMENTS OF THE INVENTION

A method for producing a laminated-resin black matrix (hereinafter referred to as "laminated-resin BM") substrate includes the step of exposing, in a single step, a laminate of a coating A of a non-photosensitive resin composition A that contains a light-shielding material and a coating B of a resin composition B that contains a light-shielding material, the laminate being on a substrate; and the step of developing the exposed laminate.

Now, preferred embodiments of the present invention will be described in detail with reference to the drawings, although the present invention is not limited to the embodiments.

Figure 1:
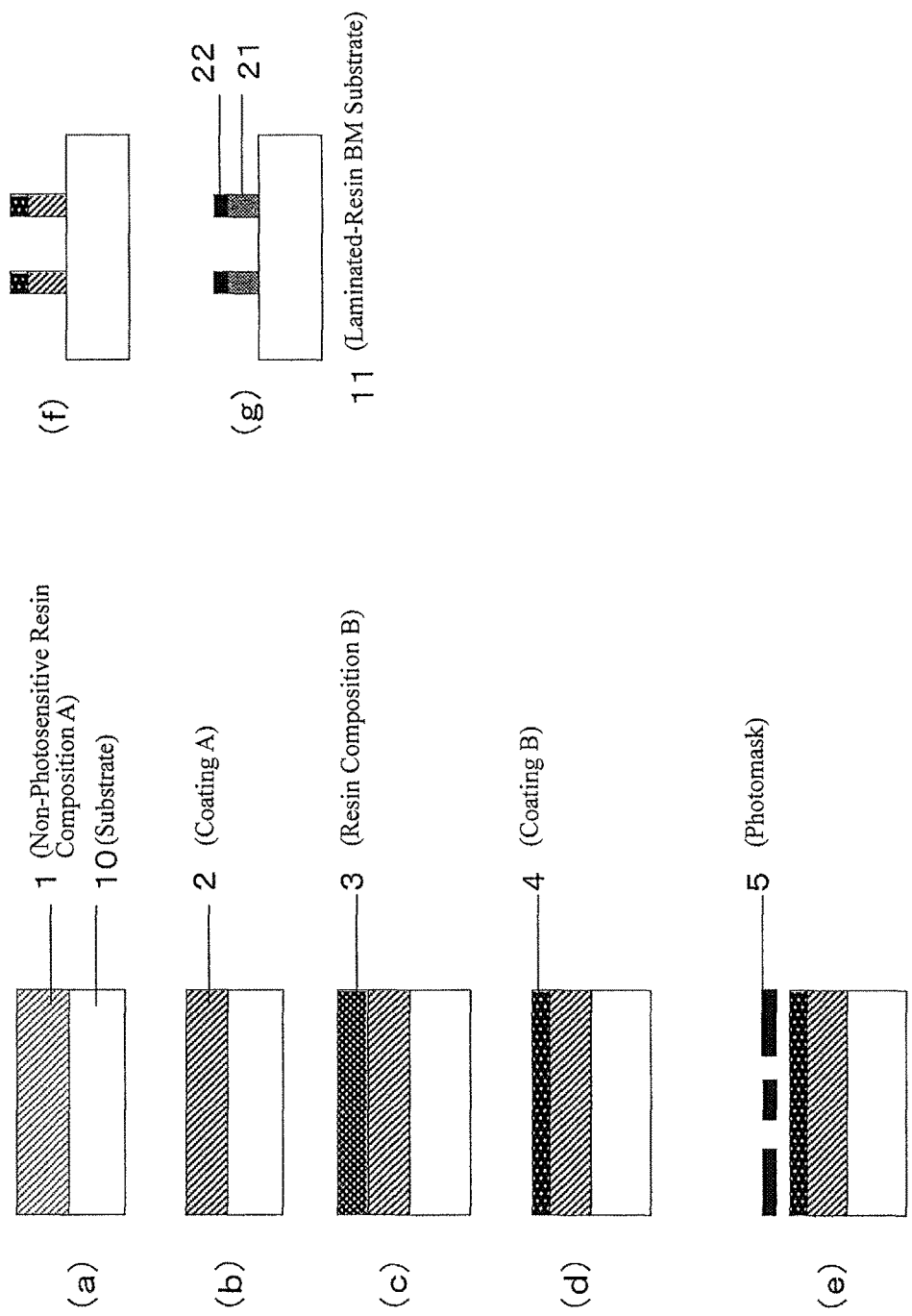
FIG. 1 is a schematic view illustrating a method for producing a laminated-resin black matrix substrate according to an embodiment of the present invention.

FIG. 1 is a schematic view illustrating a process for producing a laminated-resin BM substrate according to an embodiment of the present invention. The illustrated method for producing a laminated-resin BM substrate includes the step of exposing, in a single step, a laminate of a coating A of a non-photosensitive resin composition A that contains a light-shielding material and a coating B of a resin composition B that contains a light-shielding material, the laminate being on a substrate (FIG. 1 (e)), and the step of developing the exposed laminate (FIG. 1(f)). The method for producing a laminated-resin BM substrate that includes such steps can provide a laminated-resin BM substrate that includes a laminate of a lower optical density layer and a higher optical density layer and that has high light-shielding capabilities, a low reflectance, and good visibility.

Preferably, a substrate 10 is transparent. Examples of the transparent substrate 10 include thin plates of inorganic glasses such as silica glass, borosilicate glass, aluminosilicate glass, and silica-coated soda-lime glass; and films and sheets of organic plastics. A preferred example of the organic plastic films is a polyimide resin film. Use of the polyimide resin film as the substrate allows production of a laminated-resin BM substrate and a color filter substrate that are flexible and that have excellent heat resistance and dimensional stability.

The polyimide resin film can be produced by applying a resin composition of a polyimide precursor such as polyamic acid on a temporary substrate and then heating and drying the composition.

First, the polyimide precursor resin composition is applied on a temporary substrate. Examples of the temporary substrate include silicon wafers, ceramic substrates, gallium arsenide substrates, soda-lime glass substrates, and alkali-free glass substrates. Examples of a method of applying the polyimide precursor resin composition on the temporary substrate include slit coating, spin coating, spray coating, roll coating, and bar coating. The spin coating and the slit coating are preferred. Next, the temporary substrate with the polyimide precursor resin composition applied thereto is dried to provide a film of the polyimide precursor resin composition. Examples of a method for drying the composition include use of a hot plate, an oven, infrared radiation, or a vacuum chamber. In the case of using a hot plate, the temporary substrate is heat-dried on the hot plate or on a fixture such as a proximity pin attached to the hot plate. Then, the film of the polyimide precursor resin composition is heated at 180-400° C. to convert the film to a polyimide resin film.

Examples of a method for releasing the polyimide resin film from the temporary substrate include mechanical release, immersion in a chemical liquid such as hydrofluoric acid or water, and irradiation of the interface between the polyimide resin film and the temporary substrate with laser. Although the polyimide resin film may be released from the temporary substrate after production of a laminated-resin BM substrate, a liquid crystal display device, or a light emitting device, it is preferred to release the film from the temporary substrate after production of a color filter substrate, in terms of dimensional stability.

Examples of a method for forming the laminate of the coating A and the coating B on the substrate include wet coating, spray coating, immersion, vapor deposition, and sputtering. Although the laminate may be formed in a single step, a method for producing a resin BM substrate of the present invention preferably further includes the step of applying the non-photosensitive resin composition A on the substrate to form the coating A (FIG. 1 (a)) and the step of applying the resin composition B on the coating A to form the coating B (FIG. 1 (c)), in order to reduce unevenness and coating defects.

Examples of a method for applying the non-photosensitive resin composition A on the substrate or applying the resin composition B on the coating A include spin coating, bar coating, blade coating, roll coating, die coating, screen printing, immersion of the substrate in the resin composition, and spraying of the resin composition onto the substrate. Among them, spin coating and die coating are preferred, because they can readily provide the coating A and the coating B that have a uniform thickness.

The ratio (M/L) of the content M of the light-shielding material in the coating B to the content L of the light-shielding material in the coating A is preferably 1.1 or more, more preferably 1.1-3.0, and still more preferably 1.2-2.0. If M/L were less than 1.1, the BM would be less effective in reducing the reflectance. If M/L were more than 3.0, the laminate might be difficult to precisely process. As used herein, L corresponds to a ratio of the content of the light-shielding material to the total solid content in the non-photosensitive resin composition A, while M corresponds to a ratio of the content of the light-shielding material to the total solid content in the resin composition B. The term total solid content refers to the content of all the components, excluding the solvent, in the non-photosensitive resin composition A or the resin composition B.

The content L of the light-shielding material in the coating A and the content M of the light-shielding material in the coating B can be determined by the following method: first, a mixture of the light-shielding material and other solids such as a resin is extracted from the coating A or B, using a micromanipulator. One mg each of the extracted mixture of the light-shielding material and the other solids is added to 99 mg each of ethanol, γ-butyrolactone, acetone, chloroform, hexane, tetrahydrofuran, dioxane, dimethylacetamide, N-methylpyrrolidone, and dimethylsulfoxide. Then each of the resultants is left at 40° C. for 12 hours for extracting the other solids. Each of the extracts is filtered to separate the solution of the other solids from the undissolved light-shielding material. Each of the filtered solutions of the other solids is observed, and 50 mg each of clear colorless solutions (half of the 100 mg solution) is weighed out and left at 150° C. for 5 hours, and then the solvent is removed. The solutions can be determined to be clear and colorless when the difference between the color of the solvent used and the color of the filtered solution of the other solids is not visually observed.

The masses of the other solids that remain after removal of the solvents are compared between the used solvents, and the maximum mass value is used as a value A. The value A can be fitted to the following Equations (1) and (2) to accurately calculate the content L of the light-shielding material in the coating A and the content M of the light-shielding material in the coating B, respectively.

Content of other solids (% by mass)=$(A \times 2)/1 \times 100$

Content of light-shielding material (% by mass)=$(1-A \times 2)/1 \times 100$

As described above, M/L is preferably 1.1 or more. Therefore, a laminated-resin BM in a laminated-resin BM substrate produced by the method of the present invention preferably includes a layer formed from the coating A having an optical density per unit thickness that is less than the optical density per unit thickness of a layer formed from the coating B. In this case, the layer formed from the coating A as a lower optical density layer can be distinguished from the layer formed from the coating B as a higher optical density layer.

In order to further reduce unevenness and coating defects, the method for producing a resin BM substrate of the present invention preferably further includes the step of semi-curing the coating A by drying or heating (FIG. 1 (b)).

In the step, the coating A is dried by, for example, air-drying, heat-drying, or vacuum drying to semi-cure the coating A. Examples of the drying method include heat-drying using a hot plate or a convection oven (a hot air dryer), drying under reduced pressure, vacuum drying, and infrared radiation. In the case of the heat-drying, the heating temperature and the heating period depend on the composition of the non-photosensitive resin composition A and the thickness of the coating A to be formed, and the coating A is preferably heated at 80-200° C. and more preferably 100-150° C. for 1-60 minutes. If the heating temperature were lower than 80° C., excessive solvent would remain. Thus the coating might be not sufficiently formed, and the coating A might show defects such as cracking and swelling/dissolution in the step of forming the coating B. If the heating temperature were higher than 200° C., the coating would be excessively cured and would exhibit insufficient solubility in a developer in the subsequent development step, which could lead to difficulty in patterning. In order to reduce dried unevenness or convey unevenness, the coating A is preferably semi-cured in two steps by dying the coating A under reduced pressure, using a vacuum dryer equipped with a heating device and then semi-curing the coating A by heating. In this case, a preferred example of the heating device provided to the vacuum dryer is a hot plate. The heating temperature in the first step is preferably in the range of from 25 to 80° C. and more preferably from 30 to 60° C. The final reduced pressure is preferably 10-200 Pa and more preferably 30-100 Pa. In the second step, the coating is heated preferably at 80 to 200° C. and more preferably at 100-150° C. for 1-60 minutes.

In the case of exposure in a single step, the coating A preferably has a thickness x of 0.6-1.5 μm and more preferably 0.7-1.3 μm. If the thickness were less than 0.6 μm, the BM might be difficult to process. If the thickness were more than 1.5 μm, the resulting laminated-resin BM substrate might have an excessively large thickness. The thickness x of the coating A can be measured using a laser microscope. More particularly, the thickness x can be determined by scratching part of the coating A with, for example, a needle to expose the substrate and observing the coating A vertically from the top under a laser microscope.

In order to further reduce unevenness and coating defects, the method for producing a resin BM substrate of the present invention preferably further includes the step of semi-curing the coating B by drying or heating (FIG. 1 (d)).

In the step, the coating B is dried by, for example, air-drying, heat-drying, or vacuum drying to semi-cure (prebake) the coating. Examples of the drying method include those described for drying or heating of the coating A. In the case of heat-drying, the heating temperature and the heating period depend on the composition of the resin composition B and the thickness of the coating B to be formed, and the coating B is heated preferably at a temperature equal to or lower than those described for drying or heating of the coating A, more preferably at 60-150° C., and still more preferably at 80-120° C. for 1-60 minutes. If the heating temperature were lower than 60° C. or higher than 150° C., the coating might be difficult to pattern.

In the case of exposure in a single step, the coating B preferably has a thickness y of 0.2-1.0 μm and more preferably 0.3-0.6 μm. If the thickness were less than 0.2 μm, the coating might show coating defects such as pinholes and tears. If the thickness were more than 1.0 μm, the exposure energy might be less likely to be transmitted into the coating in the exposure step, which might lead to difficulty in patterning. The thickness y of the coating B can be measured using a laser microscope, as above for the coating A. More particularly, the thickness (x+y) of the laminate of the coating A and the coating B is determined by scratching part of the laminate with, for example, a needle to expose the substrate and observing the laminate vertically from the top under a laser microscope. The previously measured thickness x of the coating A is subtracted from the thickness (x+y) to determine the thickness y. When it is difficult to separately measure the thickness of the coating A, the thickness x of the coating A and the thickness y of the coating B may be separately determined by cutting the laminate of the coating A and the coating B together with the substrate and examining the cross section by SEM (scanning electron microscopy).

In the step of exposing the laminate of the coating A and the coating B in a single step (FIG. 1 (e)), the coating B is preferably exposed to radiation such as ultra-violet light from an exposure device. Examples of a lamp that can be used in the exposure step include ultra-high-pressure mercury lamps, chemical lamps, high-pressure mercury lamps, low-pressure mercury lamps, and UV LED lamps. The laminate is exposed to ultra-violet light from an exposure device through a photomask 5 having a desired pattern to project the pattern. Preferably, the photomask is a negative mask that has areas that do not contain a mask material and are transparent to radiation, where a laminated-resin BM is to be formed, and areas that contain a mask material, where a laminated-resin BM is not to be formed. The radiation exposure dose is expressed as the time integral of irradiance. For example, when the laminate is exposed to radiation at a wavelength of 365 nm, the radiation dose is preferably 10-1000 mJ/cm$^2$ and more preferably 20-200 mJ/cm$^2$.

In the step of developing the exposed laminate of the coating A and the coating B, the laminate is developed in a developer. In the step illustrated in FIG. 1 (e), it is preferred to dissolve the unexposed areas of the coating A and the coating B in the developer and to leave the exposed areas of the coating A and the coating B to form a pattern. When the unexposed areas are dissolved in the developer, it means that the coatings are dissolved and/or dispersed in the developer and that the components such as a resin and a light-shielding material of the coating A and the coating B are diffused into the developer. Examples of the developer include organic solvents, acidic developers, and alkali developers. In terms of safety and development performance, alkali developers that contain an alkaline material are preferred. Examples of the alkaline material include inorganic alkalis such as sodium hydroxide, potassium hydroxide, sodium carbonate, potassium carbonate, sodium silicate, sodium metasilicate, and aqueous ammonia; and organic alkalis such as primary amines such as ethylamine and n-propylamine, secondary amines such as diethylamine and di-n-propylamine, tertiary amines such as triethylamine and methyldiethylamine, tetraalkylammonium hydroxides such as tetramethylammonium hydroxide (hereinafter referred to as "TMAH"), quaternary ammonium salts such as choline, alcohol amines such as triethanolamine, diethanolamine, monoethanolamine, dimethylaminoethanol, and diethylaminoethanol, and cyclic amines such as pyrrole, piperidine, 1,8-diazabicyclo[5,4,0]-7-undecene, 1,5-diazabicyclo[4,3,0]-5-nonane, and morpholine. Among them, aqueous alkali solutions are preferred, because the solutions have a good ability to dissolve the coatings and are less likely to cause odor problems. Aqueous alkali solutions that contain sodium hydroxide and/or sodium carbonate, potassium hydroxide and/or potassium carbonate, or TMAH are more preferred. Preferably, the alkaline material constitutes 0.01-50% by mass of the alkali developer. To provide finer patterning, the alkali developer preferably further contains a surfactant such as a nonionic surfactant in an amount of 0.01-1% by mass. Examples of a method of development with the alkali developer include dip developing, shower developing, puddle developing, and ultrasonic developing. In the shower developing, the shower preferably provides the developer at a pressure of 0.05-5 MPa. After development, the laminate may be optionally washed with, for example, pure water to remove the alkali developer. Preferably, the laminate is developed at 20-30° C. for 10-120 seconds.

The method for producing a resin BM substrate of the present invention preferably further includes the step of heating the resultant laminated-resin BM (FIG. 1 (g)).

In the step, the patterned laminate, i.e., the laminated-resin BM produced in the step illustrated in FIG. 1(f) is completely cured by heating to complete a laminated-resin BM substrate that includes a laminate of a lower optical density layer and a higher optical density layer on the substrate. For example, the BM is preferably continuously or intermittently heated under air, nitrogen, or vacuum at 150-300° C. for 0.25-5 hours. The heating temperature is more preferably 230° C.-275° C. and still more preferably 245° C.-260° C. If the heating temperature were excessively low, the coating A would not be sufficiently cured and would tend to have reduced adhesion to the substrate. If the heating temperature were excessively high, a resin component of the coating B would be oxidatively degraded, and the coating might become brittle.

In the method of the present invention, the ratio (x/y) of the thickness x of the coating A to the thickness y of the coating B is preferably 1.5-5.0 and more preferably 2.0-3.0. The inventors of the present invention have found that production of a laminated-resin BM having a ratio in the above range allows for production of a laminated-resin BM substrate that has a sufficient optical density and a low reflectance and that can be precisely processed.

If the x/y were less than 1.5, the thickness x of the coating A would be relatively reduced. Thus, the coating A would be less effective in acting as a lower optical density layer to reduce reflected light, and the dissolution time of the coating A would be much shorter than the dissolution time of the coating B, which might be make the BM difficult to precisely process. If the x/y were more than 5.0, the thickness x of the coating A would be relatively increased, and thus the dissolution time of the coating A would be much longer than the dissolution time of the coating B, which might form a pattern wider than desired and then might make the BM difficult to precisely process.

The dissolution time of the coating A can be expressed as the product $xv_a$ (sec) of the thickness x of the coating A and the etching rate $v_a$ (sec/μm). As used herein, the etching rate $v_a$ (sec/μm) refers to the dissolution time per micrometer of thickness of the coating A and can be determined by measuring the time required to dissolve, by the developer, 1 μm of the coating A on the substrate. Similarly, the dissolution time of the coating B can be expressed as the product $yv_b$ (sec) of the thickness y of the coating B and the etching rate $v_b$ (sec/μm). As used herein, the etching rate $v_b$ (sec/μm) refers to the dissolution time per micrometer of thickness of the coating B and can be determined by measuring the time required to dissolve, by the developer, 1 μm of unexposed areas of the coating B on the substrate, i.e. areas where a pattern is not to be formed. The dissolution time is a time from initiation of contact of the coating with the developer to exposure of part of the substrate due to dissolution of the coating by the developer and can be measured by visual observation.

The difference between the dissolution time of the coating A and the dissolution time of the coating B ($yv_b - xv_a$) is preferably from −15 to 15 seconds, i.e., not more than ±15 seconds, and more preferably from −5 to 10 seconds. When the difference between the dissolution time of the coating A and the dissolution time of the coating B is in the above range, high-precision laminated-resin BM substrate can be consistently produced. If the difference between the dissolution time of the coating A and the dissolution time of the coating B were less than −15 seconds, a longer period of time would be required to dissolve the coating A, and thus exposed areas of the coating B would be excessively etched, which would be likely to cause over-development and pattern defects and the like. In contrast, if the difference were more than 15 seconds, the coating A would be excessively etched, which would be likely to cause over-development and pattern defects and the like.

The total (x+y) of the thickness x of the coating A and the thickness y of the coating B is preferably 1.2-2.0 µm and more preferably 1.5-2.0 µm. If the total were less than 1.2 µm, it would be difficult to provide a sufficient optical density (herein after referred to as "OD value"). If the total were more than 2.0 µm, the final laminated-resin BM would have an excessively large thickness.

In the step of heating a laminated-resin BM as illustrated in FIG. 1 (g), the coating A and the coating B shrink while they are being cured, and thus the resultant laminated-resin BM substrate includes a lower optical density layer having a thickness that is less than the thickness x of the coating A and a higher optical density layer having a thickness that is less than the thickness y of the coating B. The laminate typically has a shrinkage that is expressed as the percentage ratio of the thickness of the lower optical density layer to the thickness x of the coating A of 70-90% and preferably 75-85%. The laminate typically has a shrinkage that is expressed as the percentage ratio of the thickness of the higher optical density layer to the thickness y of the coating B of 70-90% and preferably 75-85%. The shrinkages depend on, for example, the type of the resin materials and the ratio of the light-shielding material. In the present invention, the ratio (x/y) of the thickness x of the coating A to the thickness y of the coating B is preferably 1.5-5.0 and more preferably 2.0-3.0, regardless of the shrinkages. If the thickness of the coating A cannot be measured, and thus the shrinkage cannot be accurately determined, the laminate having a shrinkage of the lower optical density layer of 80% can still provide the effect of the present invention. If the thickness of the coating B cannot be measured, and thus the shrinkage cannot be accurately determined, the laminate having a shrinkage of the higher optical density layer of 80% can still provide the effect of the present invention.

A laminated-resin BM in a laminated-resin BM substrate produced by the method of the present invention preferably has a total thickness of 1.0-1.6 µm and more preferably 1.2-1.6 If the thickness were less than 1.0 µm, it would be difficult to provide a sufficient OD value. It the thickness were more than 1.6 µm, the BM would lead to defects in orientation of liquid crystals, which would reduce contrast. The lower optical density layer formed from the coating A preferably has a thickness of 0.6-1.2 µm and more preferably 0.8-1.2 µm. The higher optical density layer formed from the coating B preferably has a thickness of 0.2-0.6 µm and more preferably 0.3-0.5 µm. When the thicknesses are in the above respective range, a high-precision laminated-resin BM substrate having a sufficient optical density value and a low reflectance can be consistently produced.

A laminated-resin BM in a laminated-resin BM substrate produced by the method of the present invention preferably has a total OD value of 2.5 or more and preferably 3-5 in the visible light range of 380-700 nm. If the total OD value were less than 2.5, the BM would be partially transparent to light from a backlight, which would cause a reduction in contrast. If the total OD value were more than 5, the amount of the light-shielding material added would increase, which would be likely to relatively increase the reflectance.

The OD value per micrometer of the lower optical density layer is preferably 0.5-3.0 and more preferably 1.3-2.5. If the OD value per micrometer were less than 0.5, reflection on the interface between the lower optical density layer and the higher optical density layer would have a greater impact, and the laminated-resin BM substrate would tend to have increased reflectance. If the OD value were more than 3.0, the lower optical density layer itself would tend to have increased reflectance.

A laminated-resin BM in a laminated-resin BM substrate produced by the method of the present invention preferably includes a layer formed from the coating A having an optical density per unit thickness that is less than the optical density per unit thickness of a layer formed from the coating B. In such case, the layer formed from the coating A as a lower optical density layer can be distinguished from the layer formed from the coating B as a higher optical density layer. The OD value per micrometer of the higher optical density layer should be larger than the OD value per micrometer of the lower optical density layer, and preferably ranges from 3.0 to 5.5 and more preferably from 3.3 to 5.2. If the OD value per micrometer were less than 3.0, the layer would need to have a larger thickness. If the OD value were more than 5.5, a larger amount of the light-shielding material would need to be added, which would tend to make the BM difficult to pattern.

The lower optical density layer preferably has an OD value of 0.5-3.0 and more preferably 0.8-2.5. If the lower optical density layer had an OD value of less than 0.5, the BM would be less effective in absorbing external light incident from the substrate, and thus reflection on the interface between the lower optical density layer and the higher optical density layer would have a greater impact, which would tend to increase the reflectance of the laminated-resin BM substrate. It the OD value were more than 3.0, the lower optical density layer would need to have a larger thickness, and thus the laminated-resin BM would have a larger thickness, which would tend to raise concerns of, for example, disruption of liquid crystal orientation.

The higher optical density layer preferably has an OD value of 1.0-3.0 and more preferably 1.3-2.1. If the higher optical density layer had an OD value of less than 1.0, the OD value might be insufficient. If the OD value were more than 3.0, the BM would be difficult to pattern.

Examples of the pattern of the laminated-resin BM formed on the laminated-resin BM substrate by the method of the present invention include rectangular, striped, square, polygonal, wave, and concave and convex patterns. The pattern preferably has a width of 3-30 µm, more preferably 3-10 µm, and still more preferably 3-6 µm. If the pattern had a width of more than 30 µm, the apertures for the pixels would be decreased, which would reduce brightness. If the width were less than 3 µm, the BM might be chipped while processing.

Figure 2:
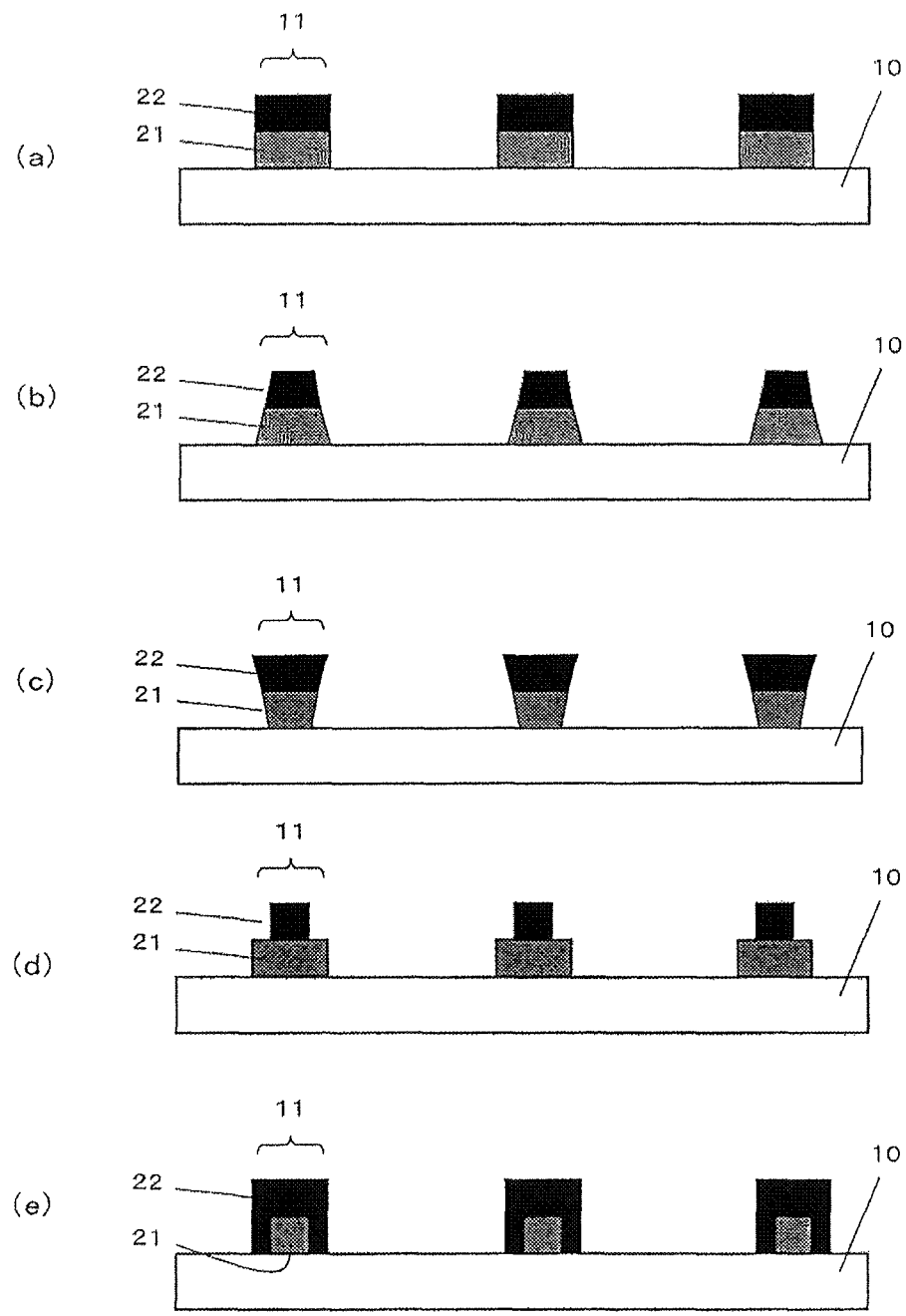
FIG. 2 is schematic cross-sectional views of laminated-resin black matrix substrates according to some embodiments of the present invention.

As illustrated in FIGS. 2 (a)-(e), a laminated-resin BM has a laminate structure. The BM may have any of a vertically laminated structure as illustrated in FIG. 2 (a), a structure laminated in a mountain shape as illustrated in FIG.

Figure 3:
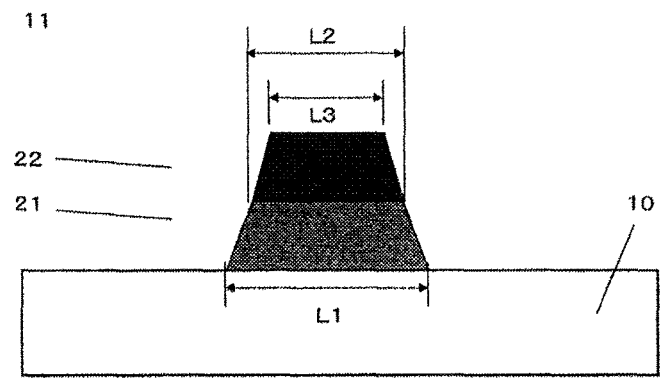
FIG. 3 is a schematic cross-sectional view of a laminated-resin black matrix substrate according to an embodiment of the present invention.

2 (b), a structure laminated in an inverted mountain shape as illustrated in FIG. 2(c), a structure including a higher optical density layer that is narrower than a lower optical density layer as illustrated in FIG. 2 (d), and a structure including a higher optical density layer that is wider than a lower optical density layer as illustrated in FIG. 2 (e). Particularly, a lower optical density layer 21 and a higher optical density layer 22 preferably have a substantially same pattern as illustrated in FIGS. 2 (a)-(c), and the layers are more preferably laminated in a mountain shape as illustrated in FIG. 2 (b), in order to reduce the width of a laminated-resin BM to increase the apertures for the pixels. As illustrated in FIG. 3, when the width of the interface between a lower optical density layer 21 and a substrate 10 is L1, the width of the interface between the lower optical density layer 21 and a higher optical density layer 22 is L2, and the width of the top of the higher optical density layer 22 is L3, it is preferred to meet the relationship of L1>L2>L3 in order to enhance the visibility. In addition, the difference between L1 and L3 is preferably not more than 3 μm, more preferably not more than 1 μm, and sill more preferably not more than 0.5 μm.

In the method of the present invention, the coating A can be formed from a non-photosensitive resin composition A that contains a light-shielding material such as, for example, a non-photosensitive resin composition A that contains a light-shielding material, a resin, and a solvent.

Examples of the light-shielding material include organic black pigments, organic color-blend pigments, and inorganic pigments. Examples of the organic black pigments include carbon blacks, resin-coated carbon blacks, perylene black, and aniline black. Examples of the organic color-blend pigments include substantially black pigments formed by mixing, for example, red, blue, green, violet, yellow, magenta, and/or cyan pigments. Examples of the inorganic pigments include graphite, and particles, oxides, composite oxides, sulfides, nitrides, and carbides of metals such as titanium, copper, iron, manganese, cobalt, chromium, nickel, zinc, calcium, and silver. Titanium nitride oxide formed by reduction of titanium oxide in nitrogen atmosphere, i.e., titanium black, titanium nitride, titanium carbide, and carbon blacks are preferred, and the titanium nitride oxide is more preferred.

As used herein, the titanium nitride oxide refers to a compound represented by TiNxOy (0<x<2.0, 0.1<y<2.0). The titanium nitride oxide having a high oxygen content would have reduced blackness, and thus x/y is preferably 0.1-10 and more preferably 1-3.

The light-shielding material preferably has a particle diameter of 10-300 nm and more preferably 30-100 nm. As used herein, the particle diameter of the light-shielding material refers to the primary particle diameter of the light-shielding material. If the light-shielding material had a particle diameter of more than 300 nm, it would be difficult to form a fine pattern. If the particle diameter were less than 10 nm, the particles of the light-shielding material would agglomerate, which would tend to result in increased reflectance.

The light-shielding material is preferably included in an amount of 20-50% by mass and more preferably 30-45% by mass, based on the total solid content of the non-photosensitive resin composition A. If the light-shielding material were included in an amount of less than 20% by mass, the dissolution time of the coating A would tend to be excessively short. If the light-shielding material were included in an amount of more than 50% by mass, the dissolution time of the coating A would tend to be excessively long. When the light-shielding material is included in an amount in the above range, based on the total solid content of the non-photosensitive resin composition A, the coating A can have a content L of the light-shielding material of 20-50% by mass.

Examples of the resin contained in the non-photosensitive resin composition A include epoxy resins, acrylic resins, siloxane polymer resins, and polyimide resins. The acrylic resins and the polyimide resins are preferred, because the resins provide a high heat resistance to the coating or provide a high storage stability to the non-photosensitive black resin composition. The polyimide resins are more preferred. As used herein, the polyimide resins include a polyamic acid resin, which is the precursor of polyimide resins having a fully closed ring structure, and polyimide resins formed by partially cyclizing a polyamic acid resin, as well as polyimide resins having a fully closed ring structure.

The polyimide resins are formed by thermal cyclization imidization of polyamic acid as the precursor. Generally, the polyamic acid resins are formed by addition polymerization of a compound having an acid anhydride group with a diamine compound at 40-100° C. and have a repeat unit represented by the following General Formula (1). The polyimide resins formed by partial cyclization of the polyamic acid resin have an amic acid structure represented by the following General Formula (2), a structure, as represented by the following General Formula (3), formed by partial cyclization imidization of the amic acid structure, and an imide structure, as represented by the following General Formula (4), formed by full cyclization imidization of the amic acid structure.

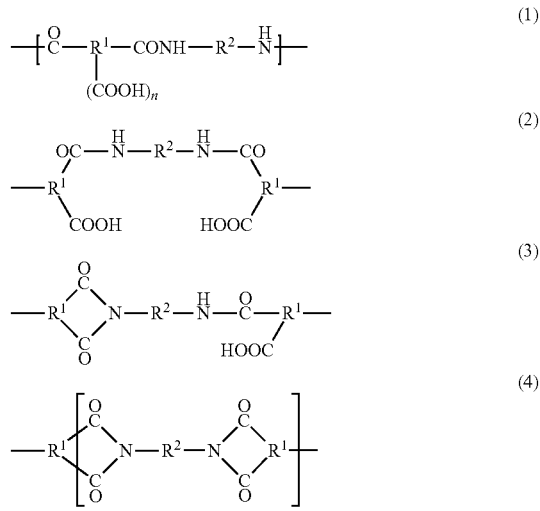

In the above General Formulas (1)-(4), $R^1$ represents a $C_2$-$C_{22}$ trivalent or quadrivalent organic group, $R^2$ represents a $C_1$-$C_{22}$ divalent organic group, and n represents an integer of 1 or 2. Preferably, each of the organic groups is selected so that aromatic tetracarboxylic acid that constitutes polyimide may provide preferred aromatic tetracarboxylic dianhydrides as described below.

In order to enhance the heat resistance and the insulating properties of the polyimide resin, the diamine compound used in production of the polyamic acid resin is preferably an aromatic diamine compound, and the compound having an acid anhydride group is preferably a dianhydride.

Examples of the aromatic diamine compound include paraphenylene diamine, methaphenylene diamine, 3,3'-diaminodiphenylether, 4,4'-diaminodiphenylether, 3,4'-diaminodiphenylether, 4,4'-diaminodiphenylmethane, 3,3'-diaminodiphenylsulfone, 4,4'-diaminodiphenylsulfone, 3,3'-diaminodiphenyl sulfide, 4,4'-diaminodiphenyl sulfide, 1,3-bis(4-aminophenoxy)benzene, 1,4-bis(4-aminophenoxy)benzene, 2,2-bis(trifluoromethyl)benzidine, 9,9'-bis(4-aminophenyl)fluorene, 4,4'-diaminodiphenylamine, 3,4'-diaminodiphenylamine, 3,3'-diaminodiphenylamine, 2,4'-diaminodiphenylamine, 4,4'-diaminodibenzylamine, 2,2'-diaminodibenzylamine, 3,4'-diaminodibenzylamine, 3,3'-diaminodibenzylamine, N,N-bis-(4-amino-3-methylphenyl) ethylenediamine, 4,4'-diaminobenzanilide, 3,4'-diaminobenzanilide, 3,3'-diaminobenzanilide, 4,3'-diaminobenzanilide, 2,4'-diaminobenzanilide, N,N'-p-phenylene bis-p-aminobenzamide, N,N'-p-phenylene bis-m-aminobenzamide, N,N'-m-phenylene bis-p-aminobenzamide, N,N'-m-phenylene bis-m-aminobenzamide, N,N'-dimethyl-N,N'-p-phenylene bis-p-aminobenzamide, N,N'-dimethyl-N,N'-p-phenylene bis-m-aminobenzamide, N,N'-diphenyl-N,N'-p-phenylene bis-p-aminobenzamide, and N,N'-diphenyl-N,N'-p-phenylene bis-m-aminobenzamide. Preferred are paraphenylene diamine, methaphenylene diamine, 3,3'-diaminodiphenylether, 4,4'-diaminodiphenylether, 3,4'-diaminodiphenylether, 3,3'-diaminodiphenylsulfone, 4,4'-diaminodiphenylsulfone, 9,9'-bis(4-aminophenyl)fluorene, and 4,4'-diaminobenzanilide.

Examples of the aromatic tetracarboxylic acid include 4,4'-oxydiphthalic dianhydride, 3,3',4,4'-benzophenone tetracarboxylic dianhydride, pyromellitic dianhydride, 3,4,9,10-perylene tetracarboxylic dianhydride, 3,3',4,4'-diphenylsulfone tetracarboxylic dianhydride, 3,3',4,4'-biphenyl tetracarboxylic dianhydride, 1,2,5,6-naphthalene tetracarboxylic dianhydride, 3,3',4,4'-paraterphenyl tetracarboxylic dianhydride, and 3,3',4,4'-metaterphenyl tetracarboxylic dianhydride. Preferred are 4,4'-biphenyl tetracarboxylic dianhydride, 4,4'-benzophenone tetracarboxylic dianhydride, and pyromellitic dianhydride. Use of fluorinated tetracarboxylic dianhydrides such as 4,4'-(hexafluoroisopropylidene)diphthalic anhydride can allow for production of a polyimide having a high transparency to radiation in the short wavelength range.

In the addition polymerization of the compound having an acid anhydride group with the diamine compound to produce the polyamic acid resin, an acid anhydride such as maleic anhydride and phthalic anhydride may be optionally added as an endcapping agent. To improve adhesion to the substrate, a Si-based acid anhydride or Si-based diamine may be used. Preferred examples of the Si-based diamine are siloxane diamines such as bis-3-(aminopropyl)tetramethylsiloxane. The siloxane diamine preferably constitutes 1-20 mol % of the total diamine content. If the siloxane diamine constituted less than 1 mol %, the adhesion would be insufficiently increased. If the siloxane diamine constituted more than 20 mol %, there would be problems such as reduced heat resistance and residual coating remaining after alkali development due to excessively high adhesion.

The compound having an acid anhydride group and the diamine compound used for production of the polyamic acid resin may be a alicyclic dianhydride and a alicyclic diamine, respectively. Examples of the alicyclic dianhydride and the alicyclic diamine include 1,2,4,5-cyclohexane tetracarboxylic dianhydride, bicyclo[2.2.2]oct-7-ene-2,3,5,6-tetracarboxylic dianhydride, bicyclo[2.2.1]heptan-2-endo-3-endo-5-exo-6-exo-2,3,5,6-tetracarboxylic dianhydride, bicyclo[2.2.1]heptan-2-exo-3-exo-5-exo-6-exo-2,3,5,6-tetracarboxylic dianhydride, bicyclo[2.2.1]heptan-2,3,5,6-tetracarboxylic dianhydride, and decahydrodimethanonaphthalene tetracarboxylic dianhydride; and bis[2-(3-aminopropoxy)ethyl]ether, 1,4-butanediol-bis(3-aminopropyl)ether, 3,9-bis(3-aminopropyl)-2,4,8,10-tetraspiro-5,5-undecane, 1,2-bis(2-aminoethoxy)ethane, 1,2-bis(3-aminopoxy)ethane, triethylene glycol-bis(3-aminopropyl)ether, polyethylene glycol-bis(3-aminopropyl) ether, 3,9-bis(3-aminopropyl)-2,4,8,10-tetraspiro-5,5-undecane, and 1,4-butanediol-bis(3-aminopropyl)ether, respectively.

Examples of the solvent contained in the non-photosensitive resin composition A include esters, aliphatic alcohols, (poly)alkylene glycol ether solvents, ketones, amide polar solvents such as N-methyl-2-pyrrolidone, N,N-dimethylacetamide, and N,N-dimethylformamide, and lactones. To improve dispersibility of a pigment as the light-shielding material, the solvent is preferably a lactone or a solvent mixture containing a lactone as a major component. As used herein, the solvent containing a lactone as a major component refers to a solvent containing a lactone that constitutes the largest part of the solvent on a mass basis. The lactones refer to $C_3$-$C_{12}$ cycloaliphatic ester compounds. Examples of the lactones include β-propiolactone, γ-butyrolactone, γ-valerolactone, δ-valerolactone, γ-caprolactone, and ε-caprolactone. In terms of solubility of the polyimide precursor, γ-butyrolactone is preferred. Examples of solvents other than lactones include 3-methyl-3-methoxybutanol, 3-methyl-3-methoxybutyl acetate, propylene glycol-mono-methyl ether, propylene glycol-mono-methyl ether acetate, dipropylene glycol-mono-methyl ether, tripropylene glycol-mono-methyl ether, propylene glycol-mono-t-butyl ether, isobutyl alcohol, isoamyl alcohol, ethyl cellosolve, ethyl cellosolve acetate, butyl cellosolve, butyl cellosolve acetate, methyl carbitol, methyl carbitol acetate, ethyl carbitol, and ethyl carbitol acetate.

The non-photosensitive resin composition A may contain, for example, an adhesion modifier, a polymeric dispersant, or a surfactant as other additives. Examples of the adhesion modifier include silane coupling agents and titanium coupling agents. Preferably, the adhesion modifier is added in an amount of 0.2-20% by mass based on the polyimide resin or the acrylic resin. Examples of the polymeric dispersant include polyethyleneimine polymeric dispersant, polyurethane polymeric dispersants, and polyallylamine polymeric dispersants. Preferably, the polymeric dispersant is added in an amount of 1-40% by mass based on the light-shielding material. Examples of the surfactant include anionic surfactants such as ammonium lauryl sulfate and polyoxyethylene alkyl ether triethanolamine sulfate; cationic surfactants such as stearylamine acetate and lauryl trimethylammonium chloride; amphoteric surfactants such as lauryl dimethylamine oxide and lauryl carboxymethyl hydroxyethyl imidazolium betaine; nonionic surfactants such as polyoxyethylene lauryl ether, polyoxyethylene stearyl ether, and sorbitan monostearate; silicone surfactants with, for example, a polydimethylsiloxane main backbone, and fluorinated surfactants. Preferably, the surfactant is added in an amount of 0.001-10% by mass and more preferably 0.01-1% by mass based on the light-shielding material. If the surfactant were added in an amount of less than 0.001% by mass, application properties, smoothness of the colored coating, or the effect of preventing formation of Benard cells would be insufficient. If the surfactant were added in an amount of more than 10% by mass, the coating would have poor physical properties.

The non-photosensitive resin composition A preferably has a total solid content of 2-30% by mass and more preferably 5-20% by mass in terms of application properties and drying properties.

Examples of a method for producing the non-photosensitive resin composition A include a method of directly dispersing the light-shielding material in a resin solution using a disperser and a method of dispersing the light-shielding material in water or an organic solvent using a disperser to produce a dispersion and then mixing the dispersion with a resin solution. Examples of the disperser for the light-shielding material include ball mills, sand grinders, three-roll mills, and high-speed impact mills. In terms of dispersion efficiency and fine dispersion, a bead mill is preferred. Examples of the bead mill include co-ball mills, basket mills, pin mills, and Dyno mills. Preferred examples of beads for the bead mills include titania beads, zirconia beads, and zircon beads. The beads for use in dispersion preferably have a diameter of no more than 0.01-5.0 mm and more preferably 0.03-1.0 mm. When the light-shielding material has a small diameter of primary particles or a small diameter of secondary particles, which are formed by aggregation of the primary particles, the beads for use in dispersion is preferably fine dispersion-beads having, for example, a diameter of no more than 0.03-0.10 mm. In this case, it is preferred to use a bead mill that includes a centrifugal separator that can separate the fine beads from a dispersion to disperse the light-shielding material. In the case of dispersing the light-shielding material that contains large particles having a size on the order of submicron, the dispersion beads preferably have a diameter of 0.10 mm or more for satisfactory grinding.

In the method of the present invention for producing a laminated-resin BM substrate, the laminate structure is formed by, for example, applying the non-photosensitive resin composition A to the substrate as described above, then applying the resin composition B, exposing both of the layers in a single step, and developing the layers to form a pattern, i.e., by single-step lamination.

To facilitate the single-step lamination, the resin composition B is preferably a photosensitive resin composition and more preferably, contains a light-shielding material, a resin, a solvent, multifunctional acrylic monomers, and a photopolymerization initiator.

Examples of the light-shielding material contained in the resin composition B include light-shielding materials similar to those contained in the non-photosensitive resin composition A. To further increase the OD value, carbon black, titanium nitride oxide, titanium nitride, and titanium carbide are preferred, and titanium nitride and titanium nitride are more preferred. As used herein, titanium nitride refers to a material that contains titanium nitride as a major component and titanium oxide $TiO_2$, low order titanium oxide $Ti_nO_{2n-1}$ ($1 \leq n \leq 20$), or titanium nitride oxide as an accessory component. Although the titanium nitride particles may contain oxygen atoms, it is preferable that the particles do not contain $TiO_2$ in order to provide a higher OD value. The particles more preferably have an oxygen atom content of 12% by mass or less and still more preferably 8% by mass or less.

Examples of a process for synthesizing titanium nitride particles include gas phase reaction processes such as electric furnace processes and thermal plasma processes. The thermal plasma processes are preferred, because the processes lower the incorporation of impurities, readily provide particles having substantially uniform particle diameters, and are highly productive. Examples of a method for generating a thermal plasma include DC arc discharge, multiple-phase arc discharge, radio frequency (RF) plasma, and hybrid plasma technologies. The radio frequency plasma technology is preferred, because the technology lowers the incorporation of impurities from an electrode.

The light-shielding material preferably has a particle diameter of 10-300 nm and more preferably 30-100 nm. As used herein, the particle diameter of the light-shielding material refers to the primary particle diameter of the light-shielding material. If the light-shielding material had a particle diameter of more than 300 nm, it would be difficult to form a fine pattern. If the particle diameter were less than 10 nm, the particles would be more likely to be aggregated, and thus the BM would tend to have increased reflectance.

The light-shielding material preferably constitutes 45-65% by mass and more preferably 50-60% by mass of the total solid content of the resin composition B. If the light-shielding material constituted less than 45% by mass, it would be difficult to provide a sufficient OD value. If the light-shielding material constituted more than 65% by mass, the dissolution time of the coating B would be excessively long, which would make the laminate difficult to pattern. When the light-shielding material is contained in an amount in the above range, based on the total solid content of the resin composition B, the coating B can have a content M of the light-shielding material of 45-65% by mass.

Examples of a resin contained in the resin composition B include resins similar to those contained in the non-photosensitive resin composition A. Among them, acrylic resins are preferred.

Among the acrylic resins, acrylic polymers having carboxyl groups are preferred. Preferred examples of the resins are copolymers of an unsaturated carboxylic acid and an ethylenically unsaturated compound. Examples of the unsaturated carboxylic acid include acrylic acid, methacrylic acid, itaconic acid, crotonic acid, maleic acid, fumaric acid, and vinyl acetic acid. Examples of the ethylenically unsaturated compound include alkyl esters of unsaturated carboxylic acids such as methyl acrylate, methyl methacrylate, ethyl acrylate, ethyl methacrylate, n-propyl acrylate, isopropyl acrylate, n-propyl methacrylate, isopropyl methacrylate, n-butyl acrylate, n-butyl methacrylate, sec-butyl acrylate, sec-butyl methacrylate, iso-butyl acrylate, iso-butyl methacrylate, tert-butyl acrylate, tert-butyl methacrylate, n-pentyl acrylate, n-pentyl methacrylate, 2-hydroxyethyl acrylate, 2-hydroxyethyl methacrylate, benzyl acrylate, and benzyl methacrylate; aromatic vinyl compounds such as styrene, p-methylstyrene, o-methylstyrene, m-methylstyrene, and α-methylstyrene; aminoalkyl esters of unsaturated carboxylic acids such as aminoethyl acrylate; glycidyl esters of unsaturated carboxylic acids such as glycidyl acrylate and glycidyl methacrylate; vinyl esters of carboxylic acids such as vinyl acetate and vinyl propionate; vinyl cyanide compounds such as acrylonitrile, methacrylonitrile, and α-chloroacrylonitrile; aliphatic conjugated dienes such as 1,3-butadiene and isoprene; and polystyrene, polymethyl acrylate, polymethyl methacrylate, polybutyl acrylate, and polybutyl methacrylate having a terminal acryloyl or methacryloyl group. Preferred are binary to quarternary copolymers formed from monomers selected from the group consisting of methacrylic acid, acrylic acid, methyl methacrylate, 2-hydroxyethyl methacrylate, benzyl methacrylate, and styrene. More preferably, the binary to quarternary copolymers have an average molecular weight (Mw) of 2,000-100,000 and an acid value of 70-150 (mgKOH/g) in order to provide an appropriate rate of dissolution in the alkali developer.

Acrylic resins having an ethylenically unsaturated group in the side chain are preferred, because the resins enhance sensitivity in the exposure step and the development step.

Preferred examples of the ethylenically unsaturated group include an acrylic group and a methacrylate group. The acrylic resins having an ethylenically unsaturated group in the side chain can be produced by addition reaction of an ethylenically unsaturated compound having a glycidyl group or an alicyclic epoxy group with the carboxyl group of an acrylic resin having carboxyl groups.

Examples of the acrylic resins having an ethylenically unsaturated group in the side chain include commercially available acrylic resins such as CYCLOMER® P (Daicel Chemical Industries, Ltd.) and alkali-soluble cardo resins. To provide an appropriate solubility in ester solvents and alkali developers, the resins preferably have an average molecular weight (Mw) of 2,000-100,000 (measured by gel permeation chromatography using tetrahydrofuran as a carrier and calculated using a calibration curve of a standard polystyrene) and an acid value of 70-150 (mgKOH/g).

The solvent contained in the resin composition B for use in formation of the higher optical density layer can be selected, as appropriate, from water and organic solvents, depending on the dispersion stability of the light-shielding material to be dispersed and the solubility of the resin component to be added. Examples of the organic solvent include esters, aliphatic alcohols, (poly)alkylene glycol ether solvents, ketones, amide polar solvents, and lactone polar solvents. Examples of the esters include benzyl acetate (boiling point: 214° C.), ethyl benzoate (boiling point: 213° C.), methyl benzoate (boiling point: 200° C.), diethyl malonate (boiling point: 199° C.), 2-ethylhexyl acetate (boiling point: 199° C.), 2-butoxyethyl acetate (boiling point: 192° C.), 3-methoxy-3-methyl-butyl acetate (boiling point: 188° C.), diethyl oxalate (boiling point: 185° C.), ethyl acetoacetate (boiling point: 181° C.), cyclohexyl acetate (boiling point: 174° C.), 3-methoxy-butyl acetate (boiling point: 173° C.), methyl acetoacetate (boiling point: 172° C.), ethyl-3-ethoxy propionate (boiling point: 170° C.), 2-ethylbutyl acetate (boiling point: 162° C.), isopentyl propionate (boiling point: 160° C.), propylene glycol monomethyl ether propionate (boiling point: 160° C.), propylene glycol monoethyl ether acetate (boiling point: 158° C.), pentyl acetate (boiling point: 150° C.), and propylene glycol monomethyl ether acetate (boiling point: 146° C.).

Examples of the solvent other than those listed above include (poly)alkylene glycol ether solvents such as ethylene glycol monomethyl ether (boiling point: 124° C.), ethylene glycol monoethyl ether (boiling point: 135° C.), propylene glycol monoethyl ether (boiling point: 133° C.), diethylene glycol monomethyl ether (boiling point: 193° C.), monoethyl ether (boiling point: 135° C.), methyl carbitol (boiling point: 194° C.), ethyl carbitol (202° C.), propylene glycol monomethyl ether (boiling point: 120° C.), propylene glycol monoethyl ether (boiling point: 133° C.), propylene glycol tert-butyl ether (boiling point: 153° C.), and dipropylene glycol monomethyl ether (boiling point: 188° C.); aliphatic esters such as ethyl acetate (boiling point: 77° C.), butyl acetate (boiling point: 126° C.), and isopentyl acetate (boiling point: 142° C.); aliphatic alcohols such as butanol (boiling point: 118° C.), 3-methyl-2-butanol (boiling point: 112° C.), and 3-methyl-3-methoxybutanol (boiling point: 174° C.); ketones such as cyclopentanone and cyclohexanone; xylene (boiling point: 144° C.); ethylbenzene (boiling point: 136° C.); and solvent naphtha (petroleum fraction, boiling point: 165-178° C.).

With increased size of substrates, there is a growing trend to apply a composition by a die coater. Thus the solvent is preferably a solvent mixture that contains a solvent having a boiling point of 150-200° C. in an amount of 30-75% by mass, in order to provide appropriate volatility and drying properties.

Examples of the multifunctional acrylic monomers contained in the resin composition B for use in formation of the higher optical density layer include multifunctional acrylic monomers and oligomers. Examples of the multifunctional acrylic monomers include bisphenol A diglycidyl ether (meth)acrylate, poly(meth)acrylate carbamate, modified bisphenol A epoxy(meth)acrylates, adipic acid 1,6-hexanediol (meth)acrylic ester, phthalic anhydride propylene oxide (meth)acrylic ester, trimellitic acid diethylene glycol (meth)acrylic ester, rosin-modified epoxy di(meth)acrylates, alkyd-modified (meth)acrylates, fluorene diacrylate oligomers, tripropylene glycol di(meth)acrylate, 1,6-hexanediol di(meth)acrylate, bisphenol A diglycidyl ether di(meth)acrylate, trimethylolpropane tri(meth)acrylate, pentaerythritol tri(meth)acrylate, triacrylformal, pentaerythritol tetra(meth)acrylate, dipentaerythritol hexa(meth)acrylate, dipentaerythritol penta(meth)acrylate, 2,2-bis[4-(3-acryloxy-2-hydroxypropoxy)phenyl]propane, bis[4-(3-acryloxy-2-hydroxypropoxy)phenyl]methane, bis[4-(3-acryloxy-2-hydroxypropoxy)phenyl]sulfone, bis[4-(3-acryloxy-2-hydroxypropoxy)phenyl]ether, 4,4'-bis[4-(3-acryloxy-2-hydroxypropoxy)phenyl]cyclohexane, 9,9-bis[4-(3-acryloxy-2-hydroxypropoxy)phenyl]fluorene, 9,9-bis[3-methyl-4-(3-acryloxy-2-hydroxypropoxy)phenyl]fluorene, 9,9-bis[3-chloro-4-(3-acryloxy-2-hydroxypropoxy)phenyl]fluorene, bis-phenoxyethanol fluorene diacrylate, bis-phenoxyethanol fluorene dimethacrylate, bis-cresol fluorene diacrylate, and bis-cresol fluorenedimethacrylate.

Appropriate selection of a combination from these multifunctional monomers and oligomers allows control of sensitivity in the exposure step and the development step and processability. In order to enhance the sensitivity, the monomers and oligomers are preferably a compound having 3 or more functional groups and more preferably a compound having 5 or more functional groups. The monomers and oligomers are more preferably dipentaerythritol hexa(meth)acrylate or dipentaerythritol penta(meth)acrylate. In addition, a (meth)acrylate that contains many aromatic rings in the molecule and a highly water-repellent fluorene ring is preferably used in combination with dipentaerythritol hexa(meth)acrylate or dipentaerythritol penta(meth)acrylate. The (meth)acrylate having a fluorene ring is preferably used in an amount of 90-40 parts by mass based on 10-60 parts by mass of dipentaerythritol hexa(meth)acrylate or dipentaerythritol penta(meth)acrylate.

Examples of the photopolymerization initiator contained in the resin composition B for use in formation of the higher optical density layer include inorganic photopolymerization initiators such as benzophenone compounds, acetophenone compounds, thioxanthone compounds, imidazole compounds, benzothiazole compounds, benzoxazole compounds, oxime ester compounds, carbazole compounds, triazine compounds, phosphorus compounds, and titanates.

More particularly, the examples include benzophenone, N,N'-tetraethyl-4,4'-diaminobenzophenone, 4-methoxy-4'-dimethylaminobenzophenone, 2,2-diethoxyacetophenone, benzoin, benzoin methyl ether, benzoin isobutyl ether, benzyl dimethyl ketal, α-hydroxy isobutylphenone, thioxanthone, 2-chlorothioxanthone, 1-hydroxycyclohexylphenylketone, 2-methyl-1-[4-(methylthio)phenyl]-2-morpholino-1-propane, IRGACURE® 369 (2-benzyl-2-dimethylamino-1-(4-morpholinophenyl)-butanone), IRGACURE® OXE01 (1,2-octanedione,1-[4-(phenylthio)-2-(O-benzyloxime)]), CGI-113 (2-[4-methylbenzyl]-2-dimethylamino-1-(4-morpholinophenyl)-butanone, tert-butylanthraquinone) and CGI-242 (ethanone, 1-[9-ethyl-6-(2-methylbenzoyl)-9H-carbazol-3-yl]-1-(O-acetyloxime)) (both from Ciba Specialty Chemicals Corp.), 1-chloroanthraquinone, 2,3-dichloroanthraquinone, 3-chloro-2-methylanthraquinone, 2-ethylanthraquinone, 1,4-naphthoquinone, 9,10-phenanthraquinone, 1,2-benzoanthraquinone, 1,4-dimethylanthraquinone, 2-phenylanthraquinone, 2-(o-chlorophenyl)-4,5-diphenylimidazole dimer, 2-mercaptobenzothiazole, 2-mercaptobenzoxazole, 4-(p-methoxyphenyl)-2,6-di-(trichloromethyl)-s-triazine, and carbazole compounds such as ADEKA® OPTOMER N-1818 and N-1919 (both from Asahi Denka Kogyo K.K). Preferred are a combination of N,N'-tetraethyl-4,4'-diaminobenzophenone, IRGACURE® 369 or CGI-113, and ADEKA® OPTOMER N-1818, ADEKA® OPTOMER N-1919 or CGI-242.

A laminated-resin BM substrate produced by the method of the present invention can be used for electronic materials and various displays. By taking advantage of its high OD and low reflectance, the substrate can be used for separation of plasma display panels (PDP), production of light-shielding images such as dielectric patterns, electrode (conductor circuit) patterns, and trace patterns on electronic components, and production of a light emitting device using, for example, an organic electroluminescence element (hereinafter referred to as "organic EL element") in combination. Particularly, the resin BM is suitably disposed, for example, in a portion between colored patterns, in a portion around colored patterns, or on an external light side of TFT to obtain the laminated-resin BM substrate in order to improve display properties of a color filter used in a color liquid crystal display device. A color filter substrate of an embodiment of the present invention is characterized in that red, green, or blue pixels are formed in apertures in a laminated-resin BM substrate produced by the method of the present invention.

Examples of a method for producing a color filter substrate of the present invention include a method for forming a laminated-resin BM on the substrate and then forming pixels by a known process for achieving the color selectivity between red (R), green (G), and blue (B), and optionally, forming an overcoat layer on the pixels. Examples of the overcoat layer include epoxy layers, acrylic epoxy layers, acrylic layers, siloxane polymer layers, polyimide layers, silicon-containing polyimide layers, and polyimide siloxane layers. In addition, a transparent conductive layer may be formed on the overcoat layer. Examples of the transparent conductive layer include thin layers of oxides such as indium tin oxide (hereinafter referred to as "ITO"). Examples of a method for forming an ITO layer having a thickness of about 0.1 μm include sputtering and vacuum deposition. Examples of materials of the pixels include inorganic films having a controlled thickness in order to transmit only certain light, dyed films, and colored resin films which are dyed or which have a dye or pigment dispersed therein.

Examples of the pigment dispersed in the pixels of a color filter/substrate composite of the present invention include those having good light fastness, good heat resistance, and good chemical resistance.

Examples of red pigments include Pigment Red (hereinafter referred to as "PR") 9, PR 48, PR 97, PR 122, PR 123, PR 144, PR 149, PR 166, PR 168, PR 177, PR 179, PR 180, PR 190, PR 192, PR 209, PR 215, PR 216, PR 217, PR 220, PR 223, PR 224, PR 226, PR 227, PR 228, PR 240, and PR 254.

Examples of orange pigments include Pigment Orange (hereinafter referred to as "PO") 13, PO 31, PO 36, PO 38, PO 40, PO 42, PO 43, PO 51, PO 55, PO 59, PO 61, PO 64, PO 65, and PO 71.

Examples of yellow pigments include Pigment Yellow (hereinafter referred to as "PY") 12, PY 13, PY 14, PY 17, PY 20, PY 24, PY 83, PY 86, PY 93, PY 94, PY 95, PY 109, PY 110, PY 117, PY 125, PY 129, PY 137, PY 138, PY 139, PY 147, PY 148, PY 150, PY 153, PY 154, PY 166, PY 168, PY 173, PY 180, and PY 185.

Examples of violet pigments include Pigment Violet (hereinafter referred to as "PV") 19, PV 23, PV 29, PV 30, PV 32, PV 36, PV 37, PV 38, PV 40, and PV 50.

Examples of blue pigments include Pigment Blue (hereinafter referred to as "PB") 15, PB 15:3, PB 15:4, PB 15:6, PB 22, PB 60, PB 64, and PB 80.

Examples of green pigments include Pigment Green (hereinafter referred to as "PG") 7, PG 10, PG 36, and PG 58.

These pigments may be optionally subjected to a surface treatment such as rosin treatment, acid treatment, and base treatment. A pigment derivative may be added as a dispersing agent.

When the pixels of a color filter substrate of the present invention are a colored resin film having a pigment dispersed therein, examples of a binder resin for use in formation of the pixels include acrylic resins, polyvinyl alcohol, polyamides, and polyimides. In terms of heat resistance and chemical resistance, polyimides are preferred.

On a color filter substrate of the present invention, fixed spacers may be formed. The fixed spacers means the spacers which are fixed to a specific area of the color filter substrate and are formed so as to contact an opposite substrate upon production of a liquid crystal display device. The spacers maintain a constant gap between the filter substrate and the opposite substrate, where a liquid crystal compound is loaded. Formation of the fixed spacers allows elimination of the step of dispersing a ball spacer or the step of kneading a rod-shaped spacer in a sealing agent in production process of a liquid crystal display device.

A color filter substrate of an embodiment of the present invention is characterized in that red, green, or blue pixels are formed in apertures in a laminated-resin BM substrate produced by the method of the present invention.

A liquid crystal display device of an embodiment of the present invention is characterized by having a liquid crystal compound filled between a color filter substrate of the present invention and an opposite substrate.

A light emitting device of an embodiment of the present invention is characterized in that the device is formed by bonding a color filter substrate of the present invention and a light emitting element together.

Preferably, the light emitting element is an organic EL element. By taking advantage of high OD and low reflectance of the laminated-resin BM substrate, a light emitting device of the present invention can effectively block excess light from the light emitting element in a black display, suppress reflection of external light, and provide a high-contrast clear display.

Figure 4:
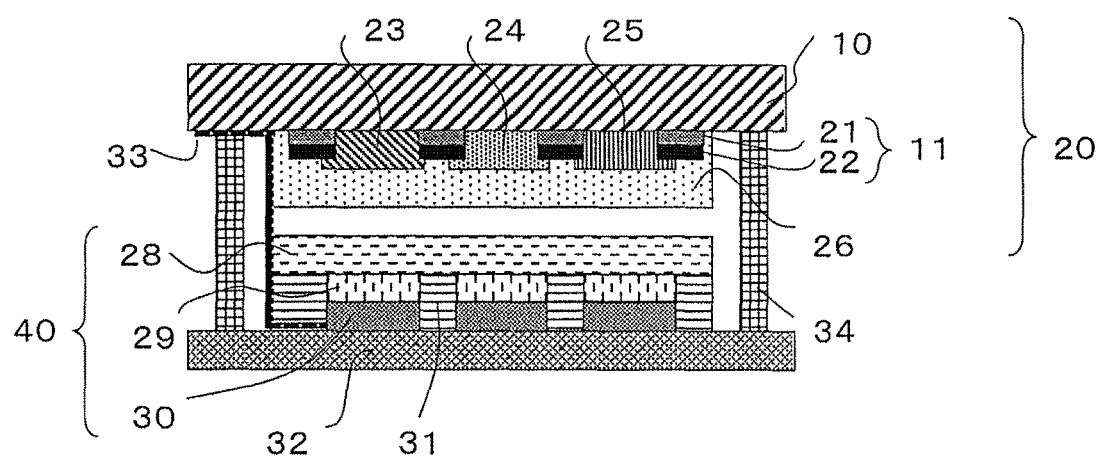
FIG. 4 is a schematic cross-sectional view of a light emitting device according to an embodiment of the present invention.

FIG. 4 is a schematic cross-sectional view illustrating a light emitting device according to an embodiment of the present invention.

The light emitting device illustrated in FIG. 4 is composed of a color filter substrate 20 and an organic EL element 40 as a light emitting element that are bonded together with a sealant 34.

The color filter substrate 20 is composed of a laminated-resin BM substrate produced by the method of the present invention, red, green, or blue pixels 23-25 formed in the apertures, and an overcoat layer 26. The laminated-resin BM substrate in the color filter substrate 20 is composed of a substrate 10, a laminated-resin BM 11 formed by laminating a lower optical density layer 21 and a higher optical density layer 22.

The organic EL element 40 is composed of a transparent electrode 28, an organic electroluminescence layer (hereinafter referred to as "organic EL layer") 29, a back electrode layer 30, an insulating layer 31, a substrate 32, and an extraction electrode 33 connected to an external power source. The organic EL layer is composed of a hole transport layer, a light emitting layer, and an electron transport layer.

Although there is a gap between the color filter substrate 20 and the organic EL element 40 in FIG. 4, a resin or a desiccant, for example, may be optionally disposed as required.

Examples of a material of the substrate 32 in the organic EL element 40 include transparent materials such as glass, film, and plastic, and opaque materials such as aluminum, chromium, stainless steel, and ceramic.

The insulating layer 31 prevents electrical transmission between the transparent electrode 28 and the back electrode layer 30. Examples of a material of the insulating layer 31 include polyimide resins, acrylic resins, epoxy resins, and silicone resins. The insulating layer 31 can be formed by photolithography using a photosensitive material.

The back electrode layer 30 is disposed between the substrate 32 and the organic EL layer 29. When a voltage is applied between the back electrode 30 and the transparent electrode 28, the organic EL layer emits light. Examples of a material of the back electrode layer include magnesium, aluminum, indium, lithium, silver, and aluminum oxide. The back electrode layer typically has a thickness of 0.01-1 µm and can be formed by, for example, forming a thin metal film by a process such as vapor deposition or sputtering and forming a pattern by photolithography.

Preferably, the organic EL layer 29 emits white light. The light emitting device can provide a desired color image by switching the pixels 23-25 in the color filter substrate 20 as appropriate depending on the wavelength composition of the white light.

Examples of a material of the light emitting layer include organic compounds having a skeleton such as cyclopentamine, tetraphenylbutadiene, triphenylamine, oxadiazole, pyrazoloquinoline, distyrylbenzene, distyrylarylene, silole, thiophene, pyridine, perinone, perylene, oligothiophene, and trifumanylamine; dyes such as oxadiazole dimer and pyrazoline dimer; metal complexes such as aluminum quinolinol complexes, benzoquinolinol beryllium complexes, benzoxazole zinc complexes, benzothiazole zinc complexes, azomethyl zinc complexes, porphyrin zinc complexes, and europium complexes, metal complexes having a rare-earth metal such as Al, Zn, Be, Tb, Eu, or Dy as the central metal and a oxadiazole, thiadiazole, phenylpyridine, phenylbenzoimidazole, or quinoline structure as a ligand; and polymers such as polyparaphenylene vinylene derivatives, polythiophene derivatives, polyparaphenylene derivatives, polysilane derivatives, polyacetylene derivatives, polyfluorene derivatives, and polyvinyl carbazole derivatives. The light emitting layer typically has a thickness of 0.05-5 µm and can be formed by, for example, vapor deposition, spin coating, printing, or inkjet printing.

The transparent electrode 28 transmits light emitted from the organic EL layer 29 and preferably has a transmittance of 80-99% and more preferably of 90-99%. Examples of a material of the transparent electrode include ITO, indium oxide, zinc oxide, and stannic oxide. The transparent electrode typically has a thickness of 0.1-1 µm and can be formed by forming a thin metal oxide layer by, for example, vapor deposition or sputtering and then forming a pattern by photolithography.

Examples of a material of the extraction electrode 33 include silver, aluminum, gold, chromium, nickel, and molybdenum.

In addition, a flexible color filter substrate that includes a polyimide resin film as a substrate can be bonded to a light emitting element to provide a flexible light emitting device. Then, the flexible color filter substrate can be bonded to an organic EL element as a light emitting element to produce a flexible organic EL display.

Each of the components in the above description can be used alone or in combination of two or more thereof, unless otherwise apparent from the context.

EXAMPLES

Now, the present invention will be described in more detail with reference to examples and comparative examples, although the present invention is not limited thereto.
<Evaluation Method>
[OD Value]
A resin BM having a desired thickness was formed on an alkali-free glass having a thickness of 0.7 mm, and the intensity of the incident light and the intensity of the transmitted light were individually measured using a microspectrometer (MCPD 2000 from Otsuka Electronics Co., Ltd.). Then the optical density was calculated using the following Equation (1):

$$\text{OD value} = \log_{10}(I_0/I) \quad (1)$$

(wherein $I_0$ is the intensity of incident light, and I is the intensity of the transmitted light.)
[Reflectance]
A resin BM having a desired thickness was formed on an alkali-free glass having a thickness 0.7 mm, and the absolute reflectance is measured at an incidence angle relative to the glass surface of 5°, using a UV-visible spectrophotometer (UV-2450 from Shimadzu Corp.). From the resultant spectrum, Y (reflectance) in the CIE XYZ colorimetric system, calculated using a D65 light source, was determined.
[Thicknesses of Coating A and Coating B]
The thickness x of the coating A and the thickness y of the coating B were determined using a laser microscope (VK-9510 from Keyence Corp.). The thickness y of the coating B was determined by subtracting the thickness x of the coating A from the thickness (x+y) of the laminate of the coating A and the coating B.
[Etching Rate]
The coating A having a thickness x of 1 µm and the coating B having a thickness y of 1 µm were formed on an alkali-free glass having a thickness 0.7 mm and then developed in a 0.5% by mass solution of tetramethylammonium hydroxide in water as an alkali developer for determination of the etching rate (sec/µm).
[Taper Width]
A test negative photomask having a width of 10 µm was used to form a laminated-resin BM substrate on an alkali-free glass having a thickness 0.7 mm, and its cross section SEM micrograph was taken. The difference between L3 and L1 (L1−L3) was determined as the taper width, wherein L1 was the width of the interface between the lower optical density layer and the substrate, and L3 was the width of the top of the higher optical density layer. The BM substrate was evaluated based on the following evaluation criteria.

A: Very good BM substrate having a taper width of from no less than 0 µm to no more than 1 µm
B: Good BM substrate having a taper width of from more than 1 µm to no more than 3 µm
C: BM substrate having a taper width of from no less than −3 µm to less than 0 µm, and having an inverted mountain shape
D: BM substrate having a taper width of less than −3 µm or more than 3 µm

[Display Performance of Liquid Crystal Displays and Light Emitting Devices]

The display performance of liquid crystal displays and light emitting devices was evaluated based on the following criteria.

A: High-contrast and very clear display showing no blurring and no uneven images
B: High-contrast clear display
C: High-contrast clear display showing slightly uneven images
D: Low performance display showing blurring and uneven images

[Adhesion]

Adhesion between the lower optical density layer and the higher optical density layer was evaluated by a method in accordance with JIS-K5600-5-6 (1999) "Adhesion Test (Cross-Cut Test)". The specific evaluation method is as follows: A laminated-resin film was formed on a substrate by irradiating an area of 50 mm×50 mm or more in the method for producing a laminated resin black matrix substrate of the present invention. Eleven longitudinal straight lines and eleven transverse straight lines that were orthogonal to the surface of the laminated-resin film were drawn at 1 mm intervals using a cutter so as to extend from the surface of the laminated-resin film on the substrate to the surface of the substrate, so that a hundred 1 mm×1 mm squares were formed. Then, CELLOTAPE® No. 405 (for industrial use) (Nichiban Co., Ltd., width=18 mm, thickness=0.050 mm, tackiness=3.93 N/10 mm, tensile strength=41.6 N/10 mm) was applied to the surface of the laminated-resin film with the squares formed thereon and then wiped with an eraser (that met the requirements of "JIS 56050 (2008)") to firmly adhere the tape to the surface. The tape was instantly peeled at an angle of 90° from the surface by lifting one edge of the tape. The area of the squares where at least part of the laminated-resin film was peeled with the CELLOTAPE® (hereinafter referred to as "adhering area") and the area of the squares where all of the laminated-resin film was peeled from the substrate (hereinafter referred to as "peeled area") were visually determined. Then, the peeled area was subtracted from the adhering area to determine the "partially peeled area". For the partially peeled area, the film was evaluated based on the following criteria. The films rated as B or higher were considered as acceptable.

A: Film having a ratio of the partially peeled area to the total area of less than 5%
B: Film having a ratio of the partially peeled area to the total area of from no less than 5% to less than 20%
C: Film having a ratio of the partially peeled area to the total area of from no less than 20% to less than 40%
D: Film having a ratio of the partially peeled area to the total area of from no less than 40% to less than 60%
E: Film having a ratio of the partially peeled area to the total area of from no less than 60% to less than 80%
F: Film having a ratio of the partially peeled area to the total area of no less than 80%

PRODUCTION EXAMPLES

Synthesis of Polyimide Resin A-1

4,4'-diaminophenyl ether (0.30 molar equivalent), paraphenylene diamine (0.65 molar equivalent), bis(3-aminopropyl)tetramethyldisiloxane (0.05 molar equivalent), 850 g of γ-butyrolactone, and 850 g of N-methyl-2-pyrrolidone were mixed. Then, 3,3',4,4'-oxydiphthalic dianhydride (0.9975 molar equivalent) was added and allowed to react at 80° C. for 3 hours. Then, maleic anhydride (0.02 molar equivalent) was added and allowed to react at 80° C. for an hour to provide a solution of a polyimide resin A-1 (polymer concentration: 20% by mass).

Synthesis of Polyimide Resin A-2

4,4'-diaminophenyl ether (0.95 molar equivalent), bis(3-aminopropyl)tetramethyldisiloxane (0.05 molar equivalent), and 1700 g of γ-butyrolactone (100%) were mixed. Then, pyromellitic dianhydride (0.49 molar equivalent) and benzophenone tetracarboxylic dianhydride (0.50 molar equivalent) were added and allowed to react at 80° C. for 3 hours. Then, maleic anhydride (0.02 molar equivalent) was added and allowed to react at 80° C. for an hour to provide a solution of a polyimide resin A-2 (polymer concentration: 20% by mass).

Synthesis of Polyimide Resin A-3

3,3'-diaminodiphenylsulfone (0.30 molar equivalent), paraphenylene diamine (0.65 molar equivalent), bis(3-aminopropyl)tetramethyldisiloxane (0.05 molar equivalent), and 1700 g of N-methyl-2-pyrrolidone were mixed. Then, 3,3',4,4'-oxydiphthalic dianhydride (0.9975 molar equivalent) was added and allowed to react at 100° C. for 3 hours. Then, maleic anhydride (0.02 molar equivalent) was added and allowed to react at 100° C. for an hour to provide a solution of a polyimide resin A-3 (polymer concentration: 20% by mass).

Synthesis of Polyimide Resin A-4

3,3',4,4'-biphenyl tetracarboxylic dianhydride (0.54 molar equivalent), trans-1,4-diaminocyclohexane (0.54 molar equivalent) and 1000 g of N-methyl-2-pyrrolidone were mixed and heated with stirring at 65° C. After 6 hours, the mixture was cooled to provide a solution of a polyimide resin A-4 (polymer concentration: 18% by mass).

Synthesis of Acrylic Polymer (P-1)

A methyl methacrylate/methacrylic acid/styrene terpolymer (mass ratio: 30/40/30) was synthesized by a method described in a reference (Example 1 of Japanese Patent No. 3120476). Then, 40 parts by mass of glycidyl methacrylate was added, re-precipitated in purified water, filtered, and dried to provide powder of an acrylic polymer (P-1) having an average molecular weight (Mw) of 40,000 and an acid value of 110 (mgKOH/g).

(Production of Light-Shielding Material Dispersion Bk1)

Titanium nitride oxide (particle diameter: 40 nm, titanium content: 70.6% by mass, nitrogen content: 18.8% by mass, oxygen content: 8.64% by mass) (96 g) described in a reference (Sample 8 in the paragraph 119 in Japanese Unexamined Patent Application Publication No. 2010-95716) as a pigment, the solution of the polyimide resin A-1 (120 g), γ-butyrolactone (114 g), N-methyl-2-pyrrolidone (538 g), and 3-methyl-3-methoxybutyl acetate (132 g) were added to a tank. After stirring in a homomixer (from Tokushu Kika Kogyo Co., Ltd.) for an hour, dispersion treatment was carried out using ULTRA APEX MILL (from Kotobuki Industries Co., Ltd.) equipped with a centrifugal separator 70%-filled with zirconia beads having a diameter of 0.05 mm (YTZ balls from Nikkato Corp.) at a revolving rate of 8 m/sec for 2 hours to provide a light-shielding material dispersion Bk1 having a solid concentration of 12% by mass and a pigment/resin ratio (by mass) of 80/20.

(Production of Light-Shielding Material Dispersion Bk2)

A light-shielding material dispersion Bk2 was produced in the same manner as for the light-shielding material dispersion Bk1 except that carbon black (MA 100 from Mitsubishi Kasei Corp.) was used as a pigment.

(Production of Light-Shielding Material Dispersion Bk3)

Titanium nitride particles (Wako Pure Chemical Industries, Ltd., particle diameter: 50 nm, titanium content: 74.3% by mass, nitrogen content: 20.3% by mass, oxygen content: 2.94% by mass) (200 g), a 45% by mass solution of the acrylic polymer (P-1) in 3-methyl-3-methoxybutanol (100 g), and propylene glycol tert-butyl ether (700 g) were added to a tank. After stirring in a homomixer for 1 hour, dispersion treatment was carried out using ULTRA APEX MILL equipped with a centrifugal separator 70%-filled with zirconia beads having a diameter of 0.05 mm at a revolving rate of 8 m/sec for 2 hours to provide a light-shielding material dispersion Bk3 having a solid concentration of 24.5% by mass and a pigment/resin ratio (by mass) of 82/18.

(Production of Light-Shielding Material Dispersion Bk4)

A light-shielding material dispersion Bk4 was produced in the same manner as for the light-shielding material dispersion Bk3 except that titanium nitride oxide (particle diameter: 40 nm, titanium content: 70.6% by mass, nitrogen content: 18.8% by mass, oxygen content: 8.64% by mass) (96 g) described in a reference (Sample 8 in the paragraph 119 in Japanese Unexamined Patent Application Publication No. 2010-95716) was used as a pigment.

(Production of Light-Shielding Material Dispersion Bk5)

A light-shielding material dispersion Bk5 was produced in the same manner as for the light-shielding material dispersion Bk3 except that carbon black (MA 100 from Mitsubishi Kasei Corp.) was used as a pigment.

Example 1

The polyimide resin A-1 (281 g), γ-butyrolactone (140 g), N-methyl-2-pyrrolidone (148 g), 3-methyl-3-methoxybutyl acetate (66 g), and LC 951 surfactant (1 g, Kusumoto Chemicals, Ltd.) were added to the light-shielding material dispersion Bk1 (364 g) to provide a non-photosensitive resin composition LL1 having a total solid concentration of 10% by mass and a light-shielding material/resin ratio (by mass) of 35/65, which corresponded to the non-photosensitive resin composition A.

A solution of a 40% by mass solution of the acrylic polymer (P-1) in propylene glycol monomethyl ether acetate (54.6 g), a 50% by mass solution of dipentaerythritol hexaacrylate (DPHA from Nippon Kayaku Co., Ltd.) as a multifunctional monomer in propylene glycol monomethyl ether acetate (63.7 g), "ADEKA ARKLS" NCI-831 (11.6 g) from ADEKA Corp. as a photopolymerization initiator, KBM 503 from Shin-Etsu Chemical Co., Ltd. (7.5 g) as an adhesion modifier, and a 10% by mass solution of a silicone surfactant in propylene glycol monomethyl ether acetate (4.0 g) were dissolved in propylene glycol monomethyl ether acetate (136.94 g). The resulting solution was added to the light-shielding material dispersion Bk3 (721.7 g) to provide a photosensitive resin composition UL1 having a total solid concentration of 25% by mass and a pigment/resin ratio (by mass) of 58/42, which corresponded to the photosensitive resin composition B.

The non-photosensitive resin composition LL1 was applied to an alkali-free glass (1737, Corning Inc., thickness: 0.7 mm) as a substrate using a spin coater to a thickness after curing of 0.6 µm, and semi-cured at 120° C. for 20 minutes to provide a coating A having a thickness of 0.75 µm. Then, the photosensitive resin composition UL1 was applied using a spin coater to a thickness after curing of 0.4 µm, and prebaked at 90° C. for 10 minutes to provide a coating B having a thickness y of 0.5 µm. The laminated coatings were exposed through a photomask to ultra-violet light at a radiation exposure dose of 200 mJ/cm$^2$, using PEM-6M mask aligner (from Union Optical Co., Ltd.).

Then, the coatings were developed in a 0.5% by mass solution of tetramethylammonium hydroxide in water as an alkali developer and then washed with pure water to obtain a patterning substrate. The resultant patterning substrate was cured by placing the substrate in a hot-air oven at 230° C. for 30 minutes to provide a laminated-resin BM substrate.

Examples 2-4

A laminated-resin BM substrate was produced in the same manner as for Example 1 except that the resin composition was applied so that, after curing, the lower optical density layer would have a thickness of 0.8 µm (Example 2), 1.0 µm (Example 3), or 1.2 µm (Example 4). The coating A had a thickness x of 1.0 µm (Example 2), 1.25 µm (Example 3), or 1.5 µm (Example 4).

Examples 5-6

A laminated-resin BM substrate was produced in the same manner as for Example 1 except that the resin composition was applied so that, after curing, the higher optical density layer would have a thickness of 0.2 µm (Example 5), 0.3 µm (Example 6), or 0.5 µm (Example 7). The coating B had a thickness y of 0.25 µm (Example 5), 0.38 µm (Example 6), or 0.63 µm (Example 7).

Examples 8-11

A non-photosensitive resin composition LL2, LL3, LL4, or LL5, which corresponded to the non-photosensitive resin composition A, was produced in the same manner as for Example 1 except that the non-photosensitive resin composition A had a concentration of the light-shielding material of 20% by mass (Example 8), 30% by mass (Example 9), 45% by mass (Example 10), or 50% by mass (Example 11). A laminated-resin BM substrate was produced in the same manner as for Example 1 except that the non-photosensitive resin composition LL2, LL3, LL4, or LL5 was applied so that, after curing, the layer would have a thickness of 1 µm. The coating A had a thickness x of 1.33 µm (Example 8), 1.28 µm (Example 9), 1.22 µm (Example 10), or 1.20 µm (Example 11). These examples had different ratios of the light-shielding materials to the resin and thus had slightly different shrinkages that were expressed as the ratio of the cured thickness to the thickness x of the coating A.

Examples 12-15

A non-photosensitive resin composition UL2, UL3, UL4, or UL5, which corresponded to the non-photosensitive resin composition A, was produced in the same manner as for Example 1 except that the photosensitive resin composition A had a content M of the light-shielding material of 45% by mass (Example 12), 50% by mass (Example 13), 60% by mass (Example 14), or 63% by mass (Example 15). A laminated-resin BM substrate was produced in the same manner as for Example 1 except that the photosensitive resin composition UL2, UL3, UL4, or UL5 was used. The coating B had a thickness y of 0.39 µm (Example 11), 0.40 µm (Example 12), 0.40 µm (Example 13), or 0.41 µm (Example 14). These examples had different ratios of the light-shielding materials to the resin and thus had slightly different shrinkages that were expressed as the ratio of the cured thickness to the thickness y of the coating B.

Example 16

The polyimide resin A-3 (281 g), N-methyl-2-pyrrolidone (288 g), 3-methyl-3-methoxybutyl acetate (66 g), and LC 951 surfactant (1 g, Kusumoto Chemicals, Ltd.) were added to the light-shielding material dispersion Bk1 (364 g) to provide a non-photosensitive resin composition LL6 having a total solid concentration of 10% by mass and a light-shielding material/resin ratio (by mass) of 35/65. A laminated-resin BM substrate was produced in the same manner as for Example 3 except that the non-photosensitive resin composition LL6 was used.

Example 17

A solution of a 40% by mass solution of the acrylic polymer (P-1) in propylene glycol monomethyl ether acetate (125.1 g), a 50% by mass solution of dipentaerythritol hexaacrylate (DPHA from Nippon Kayaku Co., Ltd.) in propylene glycol monomethyl ether acetate (123.3 g) as a multifunctional monomer, KBM503 from Shin-Etsu Chemical Co., Ltd. (7.5 g) as an adhesion modifier, and a 10% by mass solution of a silicone surfactant in propylene glycol monomethyl ether acetate (4.0 g) were dissolved in propylene glycol monomethyl ether acetate (304.6 g). The resulting solution was added to the light-shielding material dispersion Bk4 (435.5 g) to provide a non-photosensitive resin composition LL7 having a total solid concentration of 25% by mass and a pigment/resin ratio (by mass) of 35/65, which corresponded to the non-photosensitive resin composition A.

The non-photosensitive resin composition LL7 was applied to an alkali-free glass (1737, Corning Inc., thickness: 0.7 mm) as a substrate using a spin coater to a thickness after curing of 1.0 µm, and semi-cured at 120° C. for 20 minutes to provide a coating A having a thickness x of 1.25 µm. Then, the photosensitive resin composition UL1 used in Example 1 was applied using a spin coater to a thickness after curing of 0.4 µm, and prebaked at 90° C. for 10 minutes to provide a coating B having a thickness y of 0.5 µm. The laminated coatings were exposed through a photomask to ultra-violet light at a radiation exposure dose of 200 mJ/cm$^2$, using PEM-6M mask aligner (from Union Optical Co., Ltd.).

Then, the coatings were developed in a 0.5% by mass solution of tetramethylammonium hydroxide in water as an alkali developer and then washed with pure water to form a patterning substrate. The resultant patterning substrate was cured by placing the substrate in a hot-air oven at 230° C. for 30 minutes to provide a laminated-resin BM substrate.

Example 18

A non-photosensitive resin composition LL8, which corresponded to the non-photosensitive resin composition A, was produced in the same manner as for Example 1 except that the light-shielding material dispersion Bk2 was used in place of the light-shielding material dispersion Bk1. A laminated-resin BM substrate was produced in the same manner as for Example 1 except that the non-photosensitive resin composition LL8 was applied so that the cured coating would have a thickness of 1.0 µm.

Example 19

A laminated-resin BM substrate was produced in the same manner as for Example 18 except that the light-shielding material dispersion Bk5 was used in place of the light-shielding material dispersion Bk3.

Example 20

A solution of the polyimide resin A-4 was applied to an alkali-free glass (AN 100 from Asahi Glass Co., Ltd.) as a temporary substrate using a slit coater. The solvent was dried under reduced pressure of 40 Pa in a vacuum dryer at a chamber inner wall temperature of 60° C. The resultant was heated in a hot-air oven at 140° C. for 20 minutes and then further heated in a hot-air oven having an oxygen concentration of 3% at 300° C. for 30 minutes to form a polyimide resin film having a thickness of 10 µm on the temporary glass-substrate.

A laminated-resin BM substrate was produced in the same manner as for Example 3 except that the resultant polyimide resin film was used as a substrate. Then, the interface between the polyimide resin film and the temporary substrate was irradiated with laser at 308 nm to peel the laminated-resin BM substrate from the temporary substrate. The evaluations were conducted using the polyimide resin film in place of the alkali-free glass having a thickness of 0.7 mm in Examples 1-19.

Example 21

A laminated-resin BM substrate was produced in the same manner as for Example 3 except that the resultant patterning substrate was placed in a hot-air oven at 245° C.

Example 22

A laminated-resin BM substrate was produced in the same manner as for Example 3 except that the resultant patterning substrate was placed in a hot-air oven at 260° C.

Example 23

A laminated-resin BM substrate was produced in the same manner as for Example 3 except that the resultant patterning substrate was placed in a hot-air oven at 275° C.

Example 24

A laminated-resin BM substrate was produced in the same manner as for Example 3 except that the resultant patterning substrate was placed in a hot-air oven at 290° C.

Comparative Example 1

The photosensitive resin composition UL1 was applied to an alkali-free glass (1737 from Corning Inc., thickness: 0.7 mm) as a substrate using a spin coater to a thickness after curing of 1.2 μm, and then prebaked at 90° C. for 10 minutes to produce a coating having a thickness of 1.5 μm. The coating was exposed through a photomask to ultra-violet light at a radiation exposure dose of 200 mJ/cm$^2$ using PEM-6M mask aligner (from Union Optical Co., Ltd.).

Then, the coating was developed in a 0.5% by mass solution of tetramethylammonium hydroxide in water as an alkali developer and then washed with pure water to provide a patterning substrate. The resultant patterning substrate was cured by placing the substrate in a hot-air oven at 230° C. for 30 minutes to provide a laminated-resin BM substrate.

Comparative Example 2

A laminated-resin BM substrate was produced in the same manner as for Comparative Example 1 except that a polyimide resin film was used as a substrate.

<Evaluation Results>

The composition of the black resin compositions and the evaluation results of the laminated-resin BM substrate produced in Examples 1-24 and Comparative Examples 1 and 2 are shown in Table 1.

The results shown in Table 1 reveal that all of the laminated-resin BM substrate produced in Examples 1-24 had an appropriate thickness and a sufficient OD value, as well as a small taper width of the laminated-resin BM and a low reflectance, and thus the substrates were suitable for reducing the effect of external light and provided high performance.

TABLE 1

| | | Example 1 | Example 2 | Example 3 | Example 4 | Example 5 | Example 6 | Example 7 |
|---|---|---|---|---|---|---|---|---|
| Less Optically Dense Layer | Black Resin Composition | LL1 | LL1 | LL1 | LL1 | LL1 | LL1 | LL1 |
| | Resin Component | A-1 | A-1 | A-1 | A-1 | A-1 | A-1 | A-1 |
| | Light-Shielding Material Type | Titanium Nitride Oxide | Titanium Nitride Oxide | Titanium Nitride Oxide | Titanium Nitride Oxide | Titanium Nitride Oxide | Titanium Nitride Oxide | Titanium Nitride Oxide |
| | Content L | 35% | 35% | 35% | 35% | 35% | 35% | 35% |
| | Thickness x of Coating A (μm) | 0.75 | 1.00 | 1.25 | 1.50 | 1.25 | 1.25 | 1.25 |
| | Thickness of Cured Coating (μm) | 0.6 | 0.8 | 1.0 | 1.2 | 1.0 | 1.0 | 1.0 |
| | OD Value per μm of Cured Coating | 1.6 | 1.6 | 1.6 | 1.6 | 1.6 | 1.6 | 1.6 |
| | OD Value | 0.96 | 1.28 | 1.6 | 1.92 | 1.6 | 1.6 | 1.6 |
| | Development Performance Etching Rate $v_a$ (sec/μm) | 15 | 15 | 15 | 15 | 15 | 15 | 15 |
| | Dissolution Time $xv_a$ (sec) | 11.3 | 15.0 | 18.8 | 22.5 | 18.8 | 18.8 | 18.8 |
| Optically Denser Layer | Black Resin Composition | UL1 | UL1 | UL1 | UL1 | UL1 | UL1 | UL1 |
| | Resin Component | P-1 | P-1 | P-1 | P-1 | P-1 | P-1 | P-1 |
| | Light-Shielding Material Type | Titanium Nitride | Titanium Nitride | Titanium Nitride | Titanium Nitride | Titanium Nitride | Titanium Nitride | Titanium Nitride |
| | Content M | 58% | 58% | 58% | 58% | 58% | 58% | 58% |
| | Thickness y of Coating B (μm) | 0.50 | 0.50 | 0.50 | 0.50 | 0.25 | 0.38 | 0.63 |
| | Thickness of Cured Coating (μm) | 0.4 | 0.4 | 0.4 | 0.4 | 0.2 | 0.3 | 0.5 |
| | OD Value per μm of Cured Coating | 5.0 | 5.0 | 5.0 | 5.0 | 5.0 | 5.0 | 5.0 |
| | OD Value | 2.0 | 2.0 | 2.0 | 2.0 | 1.0 | 1.5 | 2.5 |
| | Development Performance Etching Rate $V_b$ (sec/μm) | 50 | 50 | 50 | 50 | 50 | 50 | 50 |
| | Dissolution Time $yv_b$ (sec) | 25 | 25 | 25 | 25 | 12.5 | 18.75 | 31.25 |
| Laminated-Resin BM Substrate | Ratio x/y of Thickness of Coating A to Thickness of Coating B | 1.5 | 2.0 | 2.5 | 3.0 | 5.0 | 3.3 | 2.0 |
| | Total x + y of Thickness of Coating A and Thickness of Coating B | 1.25 | 1.5 | 1.8 | 2.0 | 1.5 | 1.6 | 1.9 |
| | Thickness of Cured Coating (μm) | 1.0 | 1.2 | 1.4 | 1.6 | 1.2 | 1.3 | 1.5 |
| | OD Value | 3.0 | 3.3 | 3.6 | 3.9 | 2.6 | 3.1 | 4.1 |
| | Ratio M/L of Contents of Light-Shielding Materials | 1.7 | 1.7 | 1.7 | 1.7 | 1.7 | 1.7 | 1.7 |
| | Difference $yv_b - xv_a$ in Dissolution Time (sec) | 13.8 | 10.0 | 6.3 | 2.5 | −6.3 | 0.0 | 12.5 |
| | Heating Temperature | 230° C. | 230° C. | 230° C. | 230° C. | 230° C. | 230° C. | 230° C. |
| | Taper Width | B | A | A | A | B | A | B |
| | Reflectance | 4.8 | 4.6 | 4.6 | 4.6 | 4.6 | 4.6 | 4.6 |
| | Display Performance of Liquid Crystal Display and Light Emitting Device | B | A | A | A | B | A | B |
| | Adhesion | B | B | B | B | B | B | B |

| | | Example 8 | Example 9 | Example 10 | Example 11 | Example 12 | Example 13 |
|---|---|---|---|---|---|---|---|
| Less Optically Dense Layer | Black Resin Composition | LL2 | LL3 | LL4 | LL5 | LL1 | LL1 |
| | Resin Component | A-1 | A-1 | A-1 | A-1 | A-1 | A-1 |
| | Light-Shielding Material Type | Titanium Nitride Oxide | Titanium Nitride Oxide | Titanium Nitride Oxide | Titanium Nitride Oxide | Titanium Nitride Oxide | Titanium Nitride Oxide |
| | Content L | 20% | 30% | 45% | 50% | 35% | 35% |
| | Thickness x of Coating A (μm) | 1.33 | 1.28 | 1.22 | 1.20 | 1.25 | 1.25 |
| | Thickness of Cured Coating (μm) | 1.0 | 1.0 | 1.0 | 1.0 | 1.0 | 1.0 |

TABLE 1-continued

|  |  |  | | | | | | |
|---|---|---|---|---|---|---|---|---|
| Optically Denser Layer | | OD Value per μm of Cured Coating | 0.9 | 1.3 | 2.5 | 2.8 | 1.6 | 1.6 |
| | | OD Value | 0.9 | 1.3 | 2.5 | 2.8 | 1.6 | 1.6 |
| | Development Performance | Etching Rate $v_a$ (sec/μm) | 10 | 13 | 27 | 32 | 15 | 15 |
| | | Dissolution Time $xv_a$ (sec) | 13.3 | 16.7 | 32.9 | 38.6 | 18.8 | 18.8 |
| | | Black Resin Composition | UL1 | UL1 | UL1 | UL1 | UL2 | UL3 |
| | | Resin Component | P-1 | P-1 | P-1 | P-1 | P-1 | P-1 |
| | Light-Shielding Material | Type | Titanium Nitride | Titanium Nitride | Titanium Nitride | Titanium Nitride | Titanium Nitride | Titanium Nitride |
| | | Content M | 58% | 58% | 58% | 58% | 45% | 50% |
| | | Thickness y of Coating B (μm) | 0.50 | 0.50 | 0.50 | 0.50 | 0.51 | 0.50 |
| | | Thickness of Cured Coating (μm) | 0.4 | 0.4 | 0.4 | 0.4 | 0.4 | 0.4 |
| | | OD Value per μm of Cured Coating | 5.0 | 5.0 | 5.0 | 5.0 | 3.3 | 4.2 |
| | | OD Value | 2.0 | 2.0 | 2.0 | 2.0 | 1.3 | 1.7 |
| | Development Performance | Etching Rate $V_b$ (sec/μm) | 50 | 50 | 50 | 50 | 32 | 41 |
| | | Dissolution Time $yv_b$ (sec) | 25 | 25 | 25 | 25 | 16.4 | 20.5 |
| Laminated-Resin BM Substrate | | Ratio x/y of Thickness of Coating A to Thickness of Coating B | 2.7 | 2.6 | 2.4 | 2.4 | 2.4 | 2.5 |
| | | Total x + y of Thickness of Coating A and Thickness of Coating B | 1.8 | 1.8 | 1.7 | 1.7 | 1.8 | 1.8 |
| | | Thickness of Cured Coating (μm) | 1.4 | 1.4 | 1.4 | 1.4 | 1.4 | 1.4 |
| | | OD Value | 2.9 | 3.3 | 4.5 | 4.8 | 2.9 | 3.3 |
| | | Ratio M/L of Contents of Light-Shielding Materials | 2.9 | 1.9 | 1.3 | 1.2 | 1.3 | 1.4 |
| | | Difference $yv_b - xv_a$ in Dissolution Time (sec) | 11.7 | 8.3 | -7.9 | -13.6 | -2.3 | 1.8 |
| | | Heating Temperature | 230° C. | 230° C. | 230° C. | 230° C. | 230° C. | 230° C. |
| | | Taper Width | B | A | A | B | A | A |
| | | Reflectance | 4.8 | 4.5 | 5.0 | 5.2 | 4.6 | 4.6 |
| | | Display Performance of Liquid Crystal Display and Light Emitting Device | B | A | A | B | B | A |
| | | Adhesion | B | B | B | B | B | B |

|  |  |  | Example 14 | Example 15 | Example 16 | Example 17 | Example 18 | Example 19 | Example 20 |
|---|---|---|---|---|---|---|---|---|---|
| Less Optically Dense Layer | | Black Resin Composition | LL1 | LL1 | LL6 | LL7 | LL8 | LL8 | LL1 |
| | | Resin Component | A-1 | A-1 | A-3 | P-1 | A-1 | A-1 | A-1 |
| | Light-Shielding Material | Type | Titanium Nitride Oxide | Titanium Nitride Oxide | Titanium Nitride Oxide | Titanium Nitride Oxide | Carbon black | Carbon black | Titanium Nitride Oxide |
| | | Content L | 35% | 35% | 35% | 35% | 35% | 35% | 35% |
| | | Thickness x of Coating A (μm) | 1.25 | 1.25 | 1.18 | 1.25 | 1.25 | 1.25 | 1.25 |
| | | Thickness of Cured Coating (μm) | 1.0 | 1.0 | 1.0 | 1.0 | 1.0 | 1.0 | 1 |
| | | OD Value per μm of Cured Coating | 1.6 | 1.6 | 1.6 | 1.6 | 1.4 | 1.4 | 1.6 |
| | | OD Value | 1.6 | 1.6 | 1.6 | 1.6 | 1.4 | 1.4 | 1.6 |
| | Development Performance | Etching Rate $v_a$ (sec/μm) | 15 | 15 | 23 | 8 | 13 | 13 | 15 |
| | | Dissolution Time $xv_a$ (sec) | 18.8 | 18.8 | 27.1 | 10.0 | 16.3 | 16.3 | 18.8 |
| Optically Denser Layer | | Black Resin Composition | UL4 | UL5 | UL1 | UL1 | UL1 | UL6 | UL1 |
| | | Resin Component | P-1 | P-1 | P-1 | P-1 | P-1 | P-l1 | P-1 |
| | Light-Shielding Material | Type | Titanium Nitride | Titanium Nitride | Titanium Nitride | Titanium Nitride | Titanium Nitride | Carbon black | Titanium Nitride |
| | | Content M | 60% | 63% | 58% | 58% | 58% | 58% | 58% |
| | | Thickness y of Coating B (μm) | 0.50 | 0.49 | 0.50 | 0.50 | 0.50 | 0.50 | 0.50 |
| | | Thickness of Cured Coating (μm) | 0.4 | 0.4 | 0.4 | 0.4 | 0.4 | 0.4 | 0.4 |
| | | OD Value per μm of Cured Coating | 5.2 | 5.2 | 5.0 | 5.0 | 5.0 | 4.6 | 5.0 |
| | | OD Value | 2.1 | 2.1 | 2.0 | 2.0 | 2.0 | 1.8 | 2.0 |
| | Development Performance | Etching Rate $v_b$ (sec/μm) | 57 | 64 | 50 | 50 | 50 | 40 | 50 |
| | | Dissolution Time $yv_b$ (sec) | 28.5 | 31.2 | 25 | 25 | 25 | 20 | 25 |
| Laminated-Resin BM Substrate | | Ratio x/y of Thickness of Coating A to Thickness of Coating B | 2.5 | 2.6 | 2.4 | 2.5 | 2.5 | 2.5 | 2.5 |
| | | Total x + y of Thickness of Coating A and Thickness of Coating B | 1.8 | 1.7 | 1.7 | 1.8 | 1.8 | 1.8 | 1.75 |
| | | Thickness of Cured Coating (μm) | 1.4 | 1.4 | 1.4 | 1.4 | 1.4 | 1.4 | 1.4 |
| | | OD Value | 3.7 | 3.7 | 3.6 | 3.6 | 3.4 | 3.2 | 3.6 |
| | | Ratio M/L of Contents of Light-Shielding Materials | 1.7 | 1.8 | 1.7 | 1.7 | 1.7 | 1.7 | 1.7 |
| | | Difference $yv_b - xv_a$ in Dissolution Time (sec) | 9.8 | 12.5 | -2.1 | 15.0 | 8.8 | 3.8 | 6.3 |
| | | Heating Temperature | 230° C. | 230° C. | 230° C. | 230° C. | 230° C. | 230° C. | 230° C. |
| | | Taper Width | A | B | A | C | A | A | A |
| | | Reflectance | 4.6 | 4.6 | 4.6 | 4.6 | 4.8 | 4.8 | 5.3 |
| | | Display Performance of Liquid Crystal Display and Light Emitting Device | A | A | A | C | A | A | B |
| | | Adhesion | B | B | B | B | B | B | B |

|  |  |  | Example 21 | Example 22 | Example 23 | Example 24 | Comparative Example 1 | Comparative Example 2 |
|---|---|---|---|---|---|---|---|---|
| Less Optically Dense Layer | | Black Resin Composition | LL1 | LL1 | LL1 | LL1 | — | — |
| | | Resin Component | A-1 | A-1 | A-1 | A-1 | — | — |

TABLE 1-continued

| | | | | | | | |
|---|---|---|---|---|---|---|---|
| | Light-Shielding Type Material | Titanium Nitride Oxide | Titanium Nitride Oxide | Titanium Nitride Oxide | Titanium Nitride Oxide | — | — |
| | Content L | 35% | 35% | 35% | 35% | — | — |
| | Thickness x of Coating A (μm) | 1.25 | 1.25 | 1.25 | 1.25 | — | — |
| | Thickness of Cured Coating (μm) | 1.0 | 1.0 | 1.0 | 1.0 | — | — |
| | OD Value per μm of Cured Coating | 1.6 | 1.6 | 1.6 | 1.6 | — | — |
| | OD Value | 1.6 | 1.6 | 1.6 | 1.6 | — | — |
| | Development Etching Rate $v_a$ (sec/μm) | 15 | 15 | 15 | 15 | — | — |
| | Performance Dissolution Time $xv_a$ (sec) | 18.8 | 18.8 | 18.8 | 18.8 | — | — |
| Optically Denser Layer | Black Resin Composition | UL1 | UL1 | UL1 | UL1 | UL1 | UL1 |
| | Resin Component | P-1 | P-1 | P-1 | P-1 | P-1 | P-1 |
| | Light-Shielding Type Material | Titanium Nitride | Titanium Nitride | Titanium Nitride | Titanium Nitride | Titanium Nitride | Titanium Nitride |
| | Content M | 58% | 58% | 58% | 58% | 58% | 58% |
| | Thickness y of Coating B (μm) | 0.50 | 0.50 | 0.50 | 0.50 | 1.50 | 1.50 |
| | Thickness of Cured Coating (μm) | 0.4 | 0.4 | 0.4 | 0.4 | 1.2 | 1.2 |
| | OD Value per μm of Cured Coating | 5.0 | 5.0 | 5.0 | 5.0 | 5.0 | 5.0 |
| | OD Value | 2.0 | 2.0 | 2.0 | 2.0 | 6.0 | 6.0 |
| | Development Etching Rate $v_b$ (sec/μm) | 50 | 50 | 50 | 50 | 50 | 50 |
| | Performance Dissolution Time $yv_b$ (sec) | 25 | 25 | 25 | 25 | 75 | 75 |
| Laminated-Resin BM Substrate | Ratio x/y of Thickness of Coating A to Thickness of Coating B | 2.5 | 2.5 | 2.5 | 2.5 | — | — |
| | Total x + y of Thickness of Coating A and Thickness of Coating B | 1.8 | 1.8 | 1.8 | 1.8 | — | — |
| | Thickness of Cured Coating (μm) | 1.4 | 1.4 | 1.4 | 1.4 | 1.2 | 1.2 |
| | OD Value | 3.6 | 3.6 | 3.6 | 3.6 | 6.0 | 6.0 |
| | Ratio M/L of Contents of Light- Shielding Materials | 1.7 | 1.7 | 1.7 | 1.7 | — | — |
| | Difference $yv_b - xv_a$ in Dissolution Time (sec) | 6.3 | 6.3 | 6.3 | 6.3 | — | — |
| | Heating Temperature | 245° C. | 260° C. | 275° C. | 290° C. | 230° C. | 230° C. |
| | Taper Width | A | A | A | A | C | C |
| | Reflectance | 4.6 | 4.6 | 4.6 | 4.6 | 6.3 | 7.6 |
| | Display Performance of Liquid Crystal Display and Light Emitting Device | A | A | A | B | D | D |
| | Adhesion | A | A | B | C | D | D |

(Production of Color Filter Substrate)

A green pigment (PG 36, 44 g), a yellow pigment (PY 138, 19 g), the polyimide resin A-2 (47 g), and γ-butyrolactone (890 g) were added to a tank and stirred for 1 hour in a homomixer (from Tokushu Kika Kogyo Co., Ltd.) to provide a G pigment predispersion G1. Then, the predispersion G1 was provided in Dyno mill KDL (from Shinmaru Enterprises Corp.) 85%-filled with zirconia beads having a diameter of 0.40 mm (TORAYCERAM beads from Toray Industries, Inc.), and dispersion treatment was carried out at a revolving rate of 11 m/sec for 3 hours to produce a G pigment dispersion G1 having a solid concentration of 7% by mass and a pigment/polymer ratio (by mass) of 90/10. The G pigment dispersion G1 was diluted with the polyimide resin A-2 and a solvent to provide a green resin composition.

An R pigment dispersion R1 having a solid concentration of 7% by mass and a pigment/polymer ratio (by mass) of 90/10 was produced in the same manner except that a red pigment (PR 254, 63 g) was added in place of the green pigment and the yellow pigment. The R pigment dispersion R1 was diluted with the polyimide resin A-2 and a solvent to provide a red resin composition.

A B pigment dispersion B1 having a solid concentration of 7% by mass and a pigment/polymer ratio (by mass) of 90/10 was produced in the same manner except that a blue pigments (PR 15:6, 63 g) was added in place of the green pigment and the yellow pigment. The B pigment dispersion B1 was diluted with the polyimide resin A-2 and a solvent to provide a blue resin composition.

The red paste was applied to each of the laminated-resin BM substrate produced in Examples 1-24 and Comparative Examples 1 and 2 to a thickness after drying of 2.0 μm, and prebaked to provide a red-colored coating of a polyimide precursor. Red pixels were formed in the same manner described above using a positive photoresist and were thermoset by heating at 290° C. In the same manner, green pixels were formed by applying the green paste and were thermoset by heating at 290° C. In the same manner, blue pixels were formed by applying the blue paste and were thermoset by heating at 290° C.

(Production of Liquid Crystal Display Device)

Each of the color filter substrates produced in Examples 1-19, Examples 21-24, and Comparative Example 1 was washed with neutral detergent. Then, an alignment layer of a polyimide resin was applied by a printing method and heated at 250° C. for 10 minutes, using a hot plate. The heated layer had a thickness of 0.07 μm. Then, the respective color filter substrate was subjected to rubbing treatment, Coated with a sealing agent by a dispensing method, and heated at 90° C. for 10 minutes, using a hot plate. In the similar manner, a glass substrate with a TFT array formed thereon was washed with neutral detergent, and an alignment layer was formed and heated. Then, the resultant was sprayed with a ball spacer having a diameter of 5.5 μm, overlapped with each color filter substrate coated with a sealing agent, and heated at 160° C. for 90 minutes under pressure in an oven to cure the sealing agent, thereby forming a cell. After each cell was left at a temperature of 120° C. and a pressure of 13.3 Pa for 4 hours, and then left under nitrogen for 0.5 hours, then, the cell was filled with a liquid crystal compound under vacuum. The cell was filled with the liquid crystal compound by placing the cell in a chamber, reducing the pressure of the chamber to 13.3 Pa at room temperature, immersing the liquid crystal injection port in a liquid crystal material, and returning the pressure to atmospheric pressure using nitrogen. After the cell was filled with the liquid crystal compound, the liquid crystal injection port was closed by UV curable resin. Then, a polarizing plate was adhered to the outside of the two glass substrates of the cell to complete the cell. In addition, the resultant cell was used to form a module, thereby completing a liquid crystal display device.

Observation of the resultant liquid crystal display devices show that the liquid crystal display devices including the laminated-resin BM substrates produced in Examples 1-19 and Examples 21-24 had good display properties even when the displays were exposed to external light, because the laminated-resin BM had a small taper-width and a low reflectance. Although the liquid crystal display device including the laminated-resin BM substrate produced in Example 17 had almost fair properties, the display showed slightly uneven images, because the pattern of the laminated-resin BM had an inverted mountain shape. The laminated-resin BM produced in Example 24 had slightly poor adhesion. In contrast, the liquid crystal display device including the resin BM substrate produced in Comparative Example 1 had an inverted taper structure and a high reflectance. Thus, the display device showed black images that looked to be floating and very poor display properties when the display device was exposed to external light.

(Production of Light Emitting Device)

A polyimide resin film was formed on a temporary substrate in the same manner as for Example 20. A photosensitive polyimide resin was used to form an insulating layer on the polyimide resin film by photolithography. After aluminum was sputtered on the insulating layer to form a thin aluminum film, patterning was carried out by photolithography to form a back electrode layer in apertures with no insulating layer. A layer of tris(8-quinolinolato)aluminum (hereinafter referred to as "Alq3") was formed on the back electrode layer by vacuum deposition to form an electron transport layer. A layer of Alq3 doped with dicyanomethylenepyran, quinacridone, and 4,4'-bis(2,2-diphenylvinyl)biphenyl was formed on the electron transport layer by vacuum deposition to form a light emitting layer. A layer of N,N'-diphenyl-N,N-bis(α-naphthyl)-1,1'-biphenyl-4,4'-diamine was formed on the light emitting layer by vacuum deposition to form a hole transport layer. Finally, a thin ITO layer was formed on the entire surface as a transparent electrode by sputtering to form an organic EL element.

The above organic EL element was bonded, with a sealant, to each of the color filter substrate that included the laminated-resin BM substrate produced in Example 20 and the color filter substrate that included the laminated-resin BM substrate produced in Comparative Example 2 so as to oppose the substrate. Then, the respective temporary substrate was removed by irradiation with laser at 308 nm to complete a light emitting device.

The light emitting device that included the laminated-resin BM substrate in Example 20 was lightweight and flexible and had a small taper width of the laminated-resin BM and a low reflectance. Thus, the device showed good display properties even when the device was exposed to external light. In contrast, although the light emitting device that included the laminated-resin BM substrate in Comparative Example 2 was lightweight and flexible, the laminated BM had an inverted taper structure and a high reflectance. Thus, the device showed black images that looked to be floating and very poor display properties when the display was exposed to external light.

DESCRIPTION OF SYMBOLS

1: non-photosensitive resin composition A
2: coating A
3: resin composition B
4: coating B
5: photomask
10: substrate
11: laminated-resin BM
20: color filter substrate
21: lower optical density layer
22: higher optical density layer
23: pixel
24: pixel
25: pixel
26: overcoat layer
28: transparent electrode
29: organic EL layer
30: back electrode layer
31: insulating layer
32: substrate
33: extraction electrode
40: organic EL element A resin BM substrate produced by the method of the present invention can be used in a color filter substrate for a display device that uses a light source such as a cold cathode fluorescent lamp or LED or a liquid crystal display device, or in a liquid crystal display device.

The invention claimed is:

1. A color filter substrate comprising red, green, or blue pixels formed in apertures in the laminated-resin black matrix substrate produced by the method comprising the step of exposing, in a single step, a laminate of a coating A of a non-photosensitive resin composition A that contains a light-shielding material and a coating B of a resin composition B that contains a light-shielding material, said laminate being on a substrate, and the step of developing the exposed laminate, wherein said step of developing the laminate is a step in which unexposed areas of the coating A and the coating B are dissolved in an alkali developer and exposed areas of the coating A and the coating B are left, wherein said laminated black matrix comprises a laminate of a coating A of a non-photosensitive resin composition A that contains a light-shielding material and a coating B of a resin composition B that contains a light-shielding material; and when the layer formed from the coating A is a lower optical density layer and the layer formed from the coating B is a higher optical density layer, and when the width of the interface between a lower optical density layer formed from the coating A and the substrate is L1, the width of the top of the higher optical density layer formed from the coating B is L3, and the width of the interface between the lower optical density layer and the higher optical density layer is L2, the relationship of L1>L2>L3 is satisfied.

2. The color filter substrate according to claim 1, wherein the ratio (M/L) of the content M of the light-shielding material in the coating B to the content L of the light-shielding material in the coating A is 1.1 or more.

3. The color filter substrate according to claim 1, wherein the resin composition B is a photosensitive resin composition.

4. The color filter substrate according to claim 1, wherein the non-photosensitive resin composition A contains a polyimide resin.

5. The color filter substrate according to claim 1, wherein the method further comprises the step of applying the non-photosensitive resin composition A on the substrate to provide the coating A, and the step of applying the resin composition B on the coating A to provide the coating B.

6. The color filter substrate according to claim 1, wherein the method further comprises the step of drying or heating the coating A, and the step of drying or heating the coating B.

7. The color filter substrate according to claim 1, wherein the method further comprises the step of heating the laminated-resin black matrix.

8. The color filter substrate according to claim 7, wherein the heating temperature is 230° C.-275° C. in the step of heating the laminated-resin black matrix.

9. The color filter substrate according to claim 1, wherein the ratio (x/y) of the thickness x of the coating A to the thickness y of the coating B is 1.5-5.0.

10. The color filter substrate according to claim 1, wherein the total (x+y) of the thickness x of the coating A and the thickness y of the coating B is 1.2-2.0 μm.

11. The color filter substrate according to claim 2, wherein the L is 20-50% by mass.

12. The color filter substrate according to claim 2, wherein the M is 45-65% by mass.

13. The color filter substrate according to claim 1, wherein the difference between the dissolution time of the coating A in areas where a pattern does not remain and the dissolution time of the coating B in areas where a pattern does not remain is not more than ±15 seconds in the step of developing the exposed laminate to provide a laminated-resin black matrix.

14. The color filter substrate according to claim 1, wherein the substrate is a polyimide resin film.

15. A liquid crystal display device comprising a liquid crystal compound filled between the color filter substrate according to claim 1 and an opposite substrate.

16. A light emitting device comprising the color filter substrate according to claim 1 bonded to a light emitting element.

17. The light emitting device according to claim 16, wherein the light emitting element is an organic EL element.

18. The color filter substrate according to claim 1, wherein the light shielding material contains titanium nitride or a material that contains titanium nitride as a major component.

* * * * *